United States Patent
Kim et al.

(10) Patent No.: US 11,961,550 B2
(45) Date of Patent: Apr. 16, 2024

(54) MEMORY DEVICE, MEMORY SYSTEM HAVING THE SAME AND OPERATING METHOD THEREOF

(71) Applicant: SAMSUNG ELECTRONICS CO., LTD., Suwon-si (KR)

(72) Inventors: Hijung Kim, Suwon-si (KR); Hoyoun Kim, Suwon-si (KR); Jungmin You, Hwaseong-si (KR); Seongjin Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 177 days.

(21) Appl. No.: 17/735,542

(22) Filed: May 3, 2022

(65) Prior Publication Data

US 2023/0154522 A1 May 18, 2023

(30) Foreign Application Priority Data

Nov. 17, 2021 (KR) .......................... 10-2021-0158856

(51) Int. Cl.
| | |
|---|---|
| G11C 11/00 | (2006.01) |
| G06F 7/544 | (2006.01) |
| G11C 11/406 | (2006.01) |
| G11C 11/408 | (2006.01) |
| G11C 11/4094 | (2006.01) |

(52) U.S. Cl.
CPC ...... *G11C 11/40622* (2013.01); *G06F 7/5443* (2013.01); *G11C 11/40611* (2013.01); *G11C 11/4085* (2013.01); *G11C 11/4094* (2013.01)

(58) Field of Classification Search
CPC ......... G11C 11/40622; G11C 11/40611; G11C 11/4085; G11C 11/4094; G11C 11/406; G11C 11/40603; G11C 11/40615; G11C 11/40618; G11C 11/408; G11C 11/4087; G06F 7/5443; G06F 3/0658; G06F 3/0659

See application file for complete search history.

(56) References Cited

U.S. PATENT DOCUMENTS

| | | | |
|---|---|---|---|
| 8,938,573 B2 | 1/2015 | Greenfield et al. | |
| 9,589,606 B2 | 3/2017 | Lin et al. | |
| 9,767,883 B2 | 9/2017 | Doo et al. | |
| 9,892,779 B2 | 2/2018 | Kang et al. | |
| 9,972,377 B2 | 5/2018 | Oh et al. | |
| 9,978,440 B2 | 5/2018 | Cho | |
| 10,090,039 B2 | 10/2018 | Doo et al. | |

(Continued)

*Primary Examiner* — Hien N Nguyen
(74) *Attorney, Agent, or Firm* — Sughrue Mion, PLLC

(57) ABSTRACT

A memory device includes a memory cell array including a plurality of memory cells connected to a plurality of wordlines and a plurality of bitlines, a target row refresh logic circuit configured to select a target row address from among a plurality of target row addresses as a refresh row address based on victim point values, and perform a refresh operation on first memory cells of the plurality of memory cells connected to a wordline of the plurality of wordlines indicated by the refresh row address, a victim point table configured to store the victim point values for the target row addresses, and a victim point accumulator configured to receive a first row address from an external device, and accumulate a first victim point value for at least one target row address corresponding to the first row address during a unit time period.

20 Claims, 22 Drawing Sheets

(56) References Cited

U.S. PATENT DOCUMENTS

| | | |
|---|---|---|
| 10,223,311 B2 | 3/2019 | Doo et al. |
| 10,446,216 B2 | 10/2019 | Oh et al. |
| 10,600,470 B2 | 3/2020 | Bang |
| 10,607,683 B2 | 3/2020 | Shin et al. |
| 10,636,476 B2 | 4/2020 | Nale |
| 10,719,467 B2 | 7/2020 | Doo et al. |
| 10,811,077 B2 | 10/2020 | Shin et al. |
| 10,860,222 B2 | 12/2020 | Shin et al. |
| 11,037,617 B2 | 6/2021 | Gans |
| 11,049,544 B2 | 6/2021 | Devaux et al. |
| 11,087,821 B2 | 8/2021 | Son et al. |
| 11,197,531 B2 | 12/2021 | Hogan |
| 2016/0202926 A1* | 7/2016 | Benedict ............... G06F 12/123 711/106 |
| 2018/0158507 A1* | 6/2018 | Bang ................. G11C 11/40611 |
| 2018/0165212 A1* | 6/2018 | Lin .................... G06F 12/0864 |
| 2019/0371391 A1* | 12/2019 | Cha .................... G06F 11/1016 |
| 2020/0381040 A1 | 12/2020 | Penny et al. |
| 2020/0388326 A1 | 12/2020 | He et al. |
| 2021/0183435 A1* | 6/2021 | Meier ............... G11C 11/40618 |
| 2023/0079457 A1* | 3/2023 | You .................. G11C 11/40622 365/222 |

* cited by examiner

| Row Address | Access Count |
|---|---|
| R3 | 50 |
| R10 | 40 |
| R12 | 40 |
| R14 | 30 |

FIG. 5B

| Row Address | Victim Point |
|---|---|
| R2 | 50 |
| R4 | 50 |
| R9 | 40 |
| R11 | 80 |
| R13 | 70 |
| R15 | 30 |

FIG. 5C

| Row Address | Access Count |
|---|---|
| R3 | 30 |
| R12 | 40 |
| R15 | 40 |

FIG. 5D

| Row Address | Victim Point |
|---|---|
| R2 | 80 (50+30) |
| R4 | 80 (50+30) |
| R9 | 40 |
| R11 | 120 (80+40) |
| R13 | 110 (70+40) |
| R14 | 40 |
| R15 | ~~30~~ 0 |
| R16 | 40 |

FIG. 5E

MEMORY DEVICE, MEMORY SYSTEM HAVING THE SAME AND OPERATING METHOD THEREOF

CROSS-REFERENCE TO RELATED APPLICATION(S)

This application is based on and claims priority to Korean Patent Application No. 10-2021-0158856, filed on Nov. 17, 2021 in the Korean Intellectual Property Office, the disclosure of which is incorporated herein by reference in its entirety.

BACKGROUND

The disclosure relates to a memory device, a memory system having the same and a method of operating the same.

Generally, a dynamic random access memory (DRAM) may perform a refresh operation to maintain stored data. That is, a DRAM may maintain data stored in a cell capacitor through a refresh operation. With the development of process techniques such as an increase in integration density, a gap between cells of DRAM has decreased. Also, due to the reduction of the gap between the cells, interference by adjacent cells or wordlines has become a factor for determining data reliability. Even when the above-mentioned interference is concentrated on a specific cell, it may be difficult to restrict access to a specific address in a random access memory such as a DRAM. Accordingly, disturbance may occur with respect to a specific cell, and refresh properties of the cell may also be affected.

SUMMARY

Provided are a memory device which may reduce row hammer disturbance, a memory system including the same, and method of operating the same.

Provided are a memory device which may prevent a double-sided row hammer attack, a memory system including the same, and method of operating the same.

Additional aspects will be set forth in part in the description which follows and, in part, will be apparent from the description, or may be learned by practice of the presented embodiments.

According to an aspect of an example embodiment, a memory device may include a memory cell array including a plurality of memory cells connected to a plurality of wordlines and a plurality of bitlines, a target row refresh logic circuit configured to select a target row address from among a plurality of target row addresses as a refresh row address based on victim point values, and perform a refresh operation on first memory cells of the plurality of memory cells connected to a wordline of the plurality of wordlines indicated by the refresh row address, a victim point table configured to store the victim point values for the target row addresses, and a victim point accumulator configured to receive a first row address from an external device, and accumulate a first victim point value for at least one target row address corresponding to the first row address during a unit time period.

According to an aspect of an example embodiment, a memory device may include an access count table configured to store an access count value for each of a plurality of target row addresses, a victim point table configured to store a victim point value for each of the plurality target row addresses and row addresses adjacent to the plurality of target row address, and a processing-in-memory (PIM) module configured to, based on a row address being received from an external device, calculate a new victim point value based on access count values of the access count table and victim point values of the victim point table.

According to an aspect of an example embodiment, a memory system may include at least one memory device and a memory controller configured to control the at least one memory device, and issue a refresh management command based on an accumulated command value. The at least one memory device may be configured to perform a target refresh operation based on a victim point table in response to the refresh management command, and the victim point table may be configured to store victim point values for target row addresses and row addresses adjacent to the target row addresses.

According to an aspect of an example embodiment, an operating method of a memory device may include receiving a row address, generating victim point values for the row address and at least one address adjacent to the row address, updating a victim point table with the victim point values, and performing a target refresh operation based the victim point table at a predetermined time. Generating the victim point values may include accumulating the victim point values corresponding to the received row addresses in each unit time period of a plurality of time periods, and calculating the victim point values corresponding to the row address based on the accumulated victim point values.

According to an aspect of an example embodiment, a memory device may include a command decoder and an address buffer configured to receive a command and an address from a memory controller, output an active command, a refresh command, a write command, or a read command by decoding the command, and output a row address and a column address corresponding to the address, a refresh controller configured to receive the refresh command and the row address, and output a first refresh address, a row hammer detector configured to receive the row address, detect a row hammer address using a victim point table, and output the detected row hammer address as a second refresh address, a row address generator configured to output one of the row address and the first refresh address as a row address signal, a target refresh address generator configured to output one of the first refresh address and the second refresh address as a target refresh address signal, a row decoder configured to select one of the row address signal and the target refresh address signal, generate a wordline signal corresponding to the selected address signal, and activate one of a plurality of wordlines in response to the wordline signal, a column decoder configured to receive the column address, and activate at least one bitline among a plurality of bitlines in response to the column address, and a memory cell array including a plurality of memory cells connected to the plurality of wordlines and the plurality of bitlines. The victim point table may be configured to store victim point values for target row addresses and row addresses adjacent to the target row addresses

BRIEF DESCRIPTION OF DRAWINGS

The above and other aspects, features, and advantages of certain embodiments of the present disclosure will be more apparent from the following description taken in conjunction with the accompanying drawings, in which:

FIGS. 5A, 5B, 5C, 5D, and 5E are diagrams illustrating a process of calculating a victim point in a memory device according to an example embodiment;

DETAILED DESCRIPTION

Hereinafter, embodiments of the present disclosure will be described as below with reference to the accompanying drawings.

Generally, a selection wordline voltage may be provided to a selected wordline in a read operation or a write operation. In this case, the voltage of the wordline may increase even when a selection wordline voltage is not applied to adjacent wordlines due to a capacitive coupling effect. When the selection wordline is repeatedly accessed, electric charges may leak from memory cells corresponding to adjacent wordlines. This phenomenon in relation to the most adjacent wordline may be referred to as row hammer. The techniques for detecting and refreshing the raw hammer has been filed by Samsung Electronics, and are described in U.S. Pat. Nos. 9,589,606, 9,767,883, 9,892,779, 9,972,377, 9,978,440, 10,090,039, 10,223,311, 10,719,467, 10,446, 216, 10,600,470, 10,607,683, 10,811,077, 10,860,222, 11,087,821, and 11,197,531, which are incorporated by reference herein.

A memory device, a memory system having the same, and a method of operating the same in an example embodiment may, by managing a victim point table associated with a row hammer address, effectively mitigate row hammer. The victim point table may be configured to calculate victim points for an adjacent row of an aggressor row and to accumulate the calculated victim points. The memory device, a memory system having the same, and a method of operating the same in example embodiments may calculate a victim point for an adjacent address corresponding to the row hammer address, and may perform a target row refresh operation using the calculated victim point table. The target row refresh operation may defend against a double sided row hammer attack.

Figure 1:
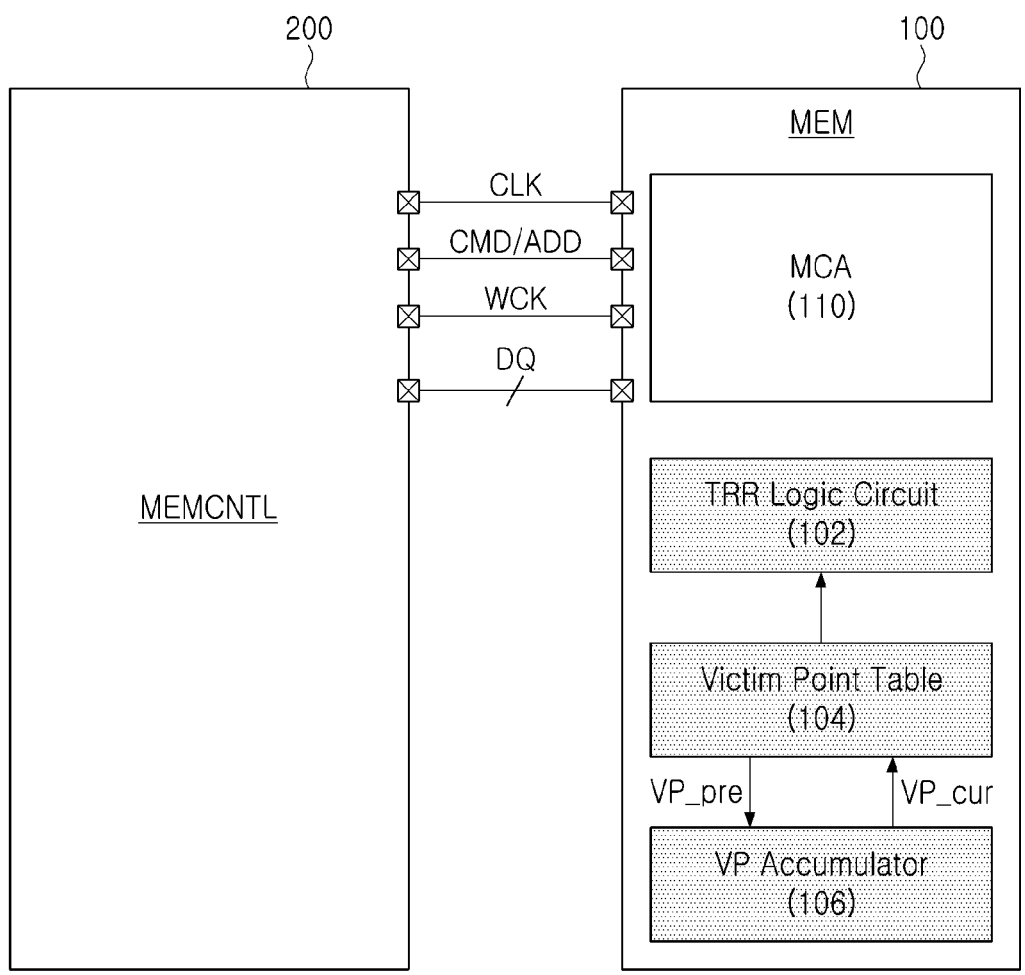
FIG. 1 is a diagram illustrating a memory system according to an example embodiment.

FIG. 1 is a diagram illustrating a memory system 10 according to an example embodiment. Referring to FIG. 1, a memory system 10 may include a memory device 100 (MEM) and a memory controller 200 (MEMCNTL) configured to control the memory device 100.

The memory system 10 may be implemented to be included in a personal computer or a mobile electronic device. Mobile electronic devices may include a laptop computer, a mobile phone, a smartphone, a tablet personal computer (PC), a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), wearable computer, an Internet of Things (IoT) device, an Internet of Everything (IoE) device, or a drone.

The memory device 100 may be implemented to store data. In an example embodiment, the memory device 100 may be implemented as a volatile memory device. For example, the volatile memory device may be implemented as random access memory (RAM), dynamic RAM (DRAM), static RAM (SRAM), or low power double data rate (LPDDR) DRAM. In an example embodiment, the memory device 100 may be implemented as a non-volatile memory device. For example, a non-volatile memory device may be implemented as electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), or ferroelectric random access memory (FRAM).

Referring back to FIG. 1, the memory device 100 may include a target row refresh (TRR) logic circuit 102, a victim point table 104, a victim point accumulator 106, and a memory cell array 110 (MCA).

The TRR logic circuit 102 may be implemented to perform a refresh operation on a target row in response to a request from an external entity (e.g., MEMCNTL, 200) or a request from an internal entity. The TRR logic circuit 102 may perform a refresh operation on the target row using information in the victim point table 104.

The victim point table 104 may include a victim point value for at least one target row. For example, the victim point table 104 may include a plurality of target row addresses and victim point values corresponding thereto.

The victim point accumulator 106 may calculate a victim point value corresponding to a target row. For example, the victim point accumulator 106 may accumulate a victim point value previously determined for an adjacent target row corresponding to a read/write requested row address in a victim point value VP_pre previously stored. Also, the victim point accumulator 106 may update the accumulated victim point value VP_cur in the victim point table 104. In an example embodiment, the victim point accumulator 106 may be implemented by a multiplier-accumulator (MAC) of a processing in memory (PIM).

The MCA 110 may include a plurality of memory banks. Each of the plurality of memory banks may include a plurality of memory cells connected to wordlines and bitlines.

As described above, the memory device 100 may perform a refresh operation on the target row in response to a command of the memory controller 200 or using the victim point table 104.

The memory controller 200 may be implemented to control the memory device 100 to read data stored in the memory device 100 or to write data to the memory device 100. The memory controller 200 may control a write operation or a read operation on the memory device 100 by providing a command CMD and an address ADDR to the memory device 100 in synchronization with a clock CLK. Also, data input/output through the data lines DQ may be transmitted/received between the memory controller 200 and the memory device 100 in synchronization with the data transmission clock WCK.

Also, the memory controller 200 may provide interfacing between a host and the memory device 100. The memory controller 200 may exchange data and signals with the memory device 100 through control signal lines /RAS, /CAS, /WE, an address line ADD, data lines DQ, and a warning signal line.

Generally, the memory device may count the number of activation (ACT) signals in a row for a predetermined time (e.g., a target refresh period (tREFI)), and may perform an additional refresh operation on rows (victim rows) adjacent to the row storing the highest count. However, the memory device may have limited resources for information storage, may easily lose the stored information, and may also not perform victim-centered aggregation. Even when the victim-centered aggregation is performed, it may be burdensome to calculate the address of the victim row for the aggressor row in every access.

The memory system 10 in an example embodiment may include the memory device 100 performing a refresh operation on the target row using the victim point table 104, thereby effectively addressing the row hammer attack using limited resources. Using the victim point table 104, the victim row may be accurately determined and row hammer may be effectively mitigated.

Figure 2:
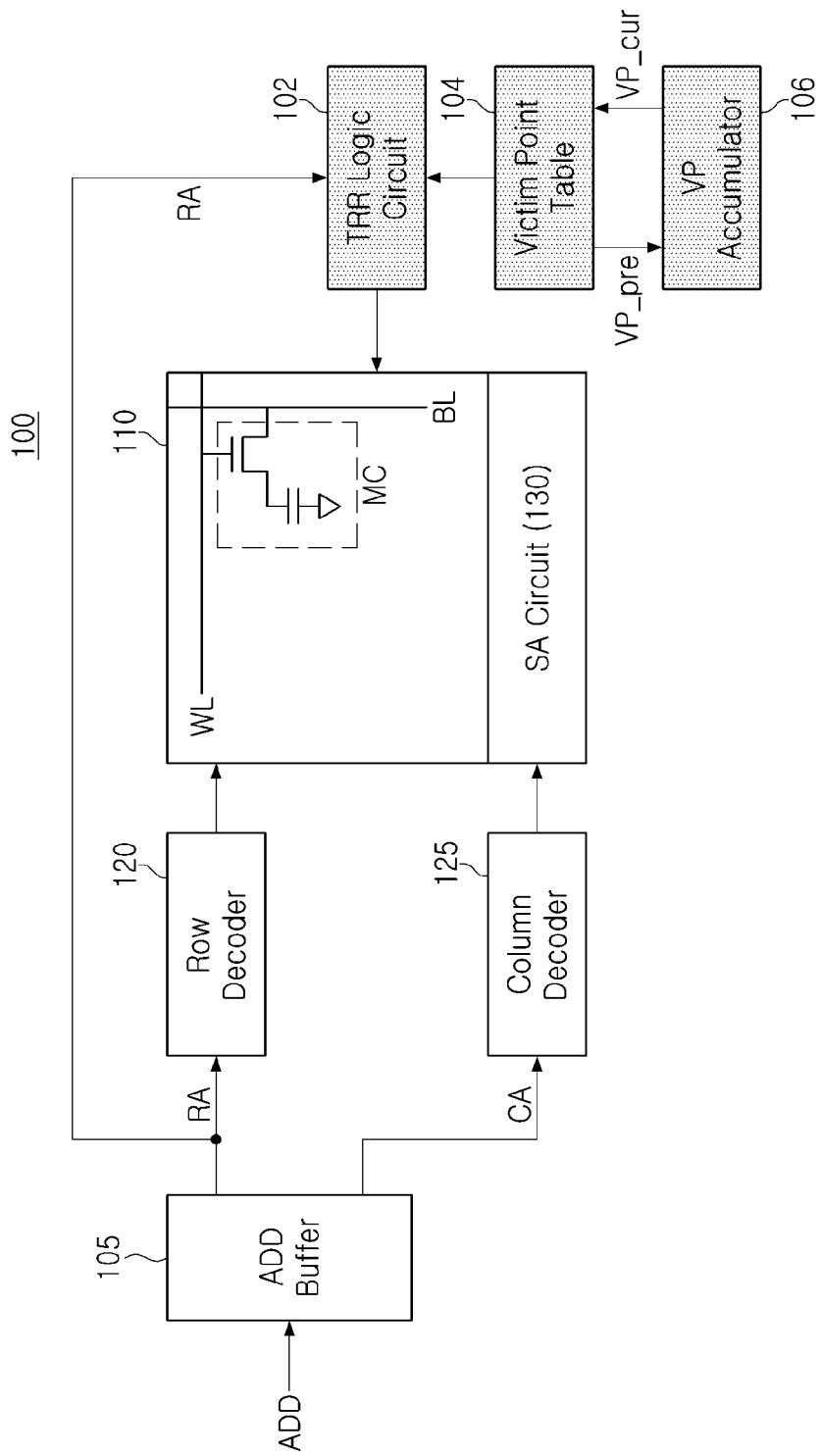
FIG. 2 is a diagram illustrating a memory device according to an example embodiment.

FIG. 2 is a diagram illustrating a memory device 100 according to an example embodiment. Referring to FIG. 2, the memory device 100 may include a TRR logic circuit 102, a victim point table 104, a victim point accumulator 106, a memory cell array 110, a row decoder 120, a column decoder 125, and a sense amplifier circuit 130.

The TRR logic circuit 102 may include first registers configured to store addresses indicating a plurality of target rows, at least one counter configured to perform an access count/ACT count corresponding to each of the addresses, and second registers configured to store corresponding access count values.

In an example embodiment, the TRR logic circuit 102 may be activated in response to an external request or an internal request. For example, the TRR logic circuit 102 may perform a refresh operation on at least one target row using the victim point table 104 in response to a refresh related command. The refresh related command may be periodically or aperiodically received from the memory controller 200 (see FIG. 1). Also, the TRR logic circuit 102 may perform a refresh operation on at least one target row using the victim point table 104 whenever a target refresh execution time (e.g., a termination time of a periodic refresh time, that is, for example, tREFI) arrives or whenever the ACT count value is greater than a predetermined value.

The victim point table 104 may be configured to store victim point values for target rows. In an example embodiment, the victim point table 104 may be updated in every predetermined unit time. The predetermined unit time may be each divided time when the periodic refresh time (e.g., tREFI) is divided into a plurality of periods. In an example embodiment, the number of the plurality of periods may vary according to environment information. The environment information may be related to an operating voltage or a temperature of the memory device 100.

The victim point accumulator 106 may accumulate victim point values for target rows in every predetermined unit time. For example, the victim point accumulator 106 may accumulate the victim point value for the adjacent row for the target row in the previous victim point value VP_pre from the victim points table 104, and may update the victim point table 104 with the accumulated victim point value VP_cur.

In an example embodiment, the updating of the victim point table 104 may be performed autonomously in the memory device 100 through a PIM function. For example, the victim point table 104 may be updated using a MAC operation of the PIM module of the memory device 100. In an example embodiment, the memory device 100 may periodically transmit only the access count table to an external memory controller having sufficient resources.

In an example embodiment, the memory device 100 may generate and manage the victim point table 104. In an example embodiment, creation and management of the victim point table 104 may be activated in response to a request from the memory controller. In an example embodiment, the PIM module of the memory device 100 may calculate a victim point for each unit time period. In another example embodiment, the memory device 100 may transmit the calculated victim point to the memory controller. The memory controller may receive victim points and may create and manage the accumulated victim point table.

The memory cell array 110 may include a plurality of bank arrays. Each of the bank arrays may include a plurality of memory cells MC formed at points at which the plurality of wordlines WL intersect with the plurality of bitlines BL. As illustrated in FIG. 2, each of the plurality of memory cells may be implemented to include a select transistor and a capacitor.

The row decoder 120 may be implemented to receive a row address RA, to decode the row address RA, and to activate a wordline corresponding to the row address RA. For example, the activated row decoder may select a wordline corresponding to the row address RA and may apply a wordline voltage to the selected wordline.

The column decoder 125 may be implemented to receive the column address CA, to select bitlines corresponding to the column address CA, and to connect sense amplifiers corresponding to the selected bitlines.

The sense amplifier circuit 130 may include a plurality of sense amplifiers connected to a plurality of bitlines. Each of the plurality of sense amplifiers may be implemented to sense data corresponding to a bitline. For example, each of the sense amplifiers may be connected to a bitline and a complementary bitline. Each of the plurality of sense amplifiers may be implemented to write data to a memory cell connected to the selected bitline or to sense data stored in the memory cell connected to the selected bitline. Also, each of the plurality of sense amplifiers may be implemented to rewrite data stored in the memory cell in a refresh operation.

Figure 3A:
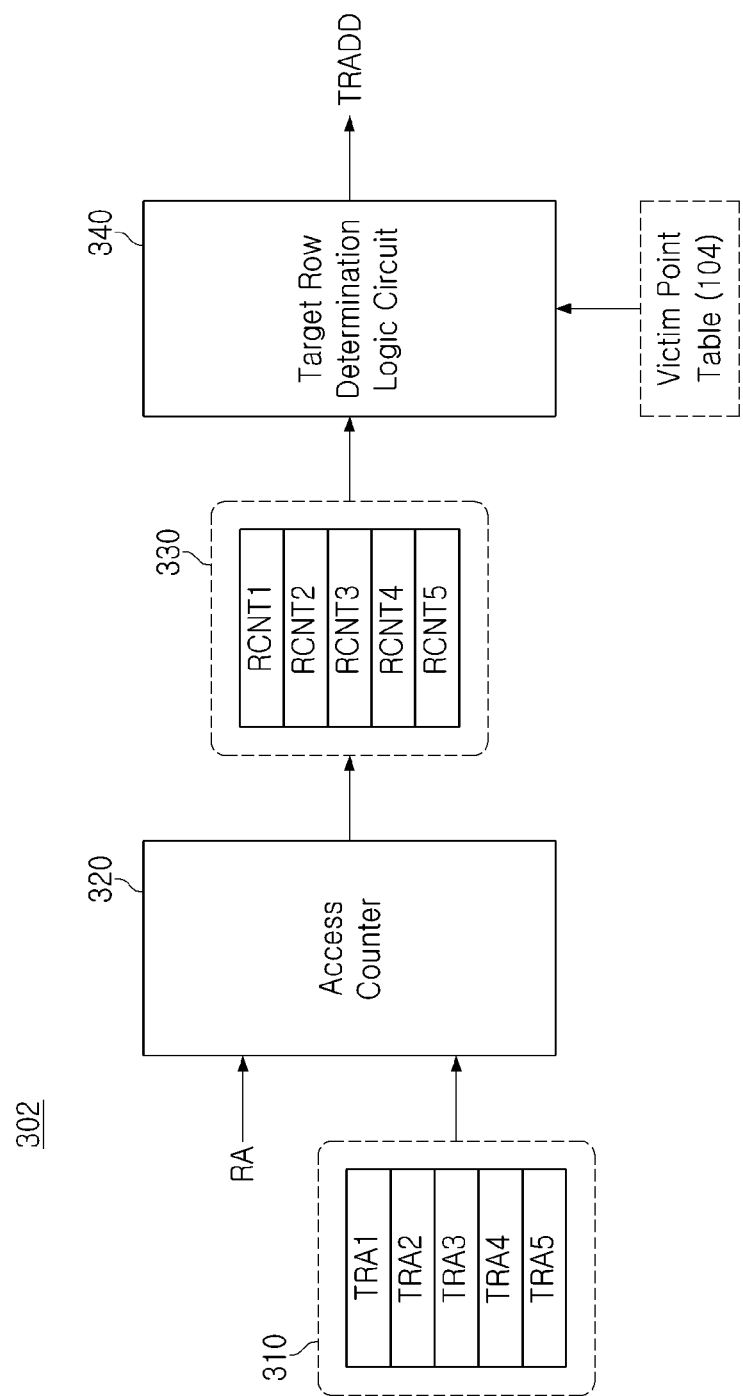
FIG. 3A is a diagram illustrating a target row refresh (TRR) logic circuit according to an example embodiment.

FIG. 3A is a diagram illustrating a TRR logic circuit 102 according to an example embodiment. Referring to FIG. 3A, the TRR logic circuit 102 may include first registers 310, second registers 320, an access counter 320, and a target row address determination logic 340.

The first registers 310 may be implemented to store a plurality of target row addresses TRA1 to TRA5. The number of target row addresses may have five in the example embodiment, but an example embodiment thereof is not limited thereto.

The second registers 320 may be implemented to store access count values RCNT1 to RCNT5 for each of a plurality of target row addresses.

The access counter 320 may be implemented to receive a row address RA in response to an input/output request and to count-up a count value for a corresponding target row address. The counted-up count values may be stored in the second registers 320. After the refresh operation of one of the target row addresses TRA1 to TRA5 is completed, the count value of the register corresponding to one of the target row addresses may be reset.

The target row address determination logic circuit 340 may select a target refresh address TRADD to be refreshed using the access count values RCNT1 to RCNT5 of the second registers 320 or the victim point table 104. For example, the target row determination logic circuit 340 may select the row address having the largest victim point in the victim point table 104 as the target refresh address TRADD in every predetermined time (e.g., tREFI). Also, the target row determination logic circuit 340 may select row addresses adjacent to the row address having the largest value among the access count values RCNT1 to RCNT5 as the target refresh address TRADD in every predetermined time (e.g., tREFI). The predetermined time may be a collection of a plurality of unit time periods.

The target row address determination logic in an example embodiment may be activated according to the entire ACT value.

Figure 3B:
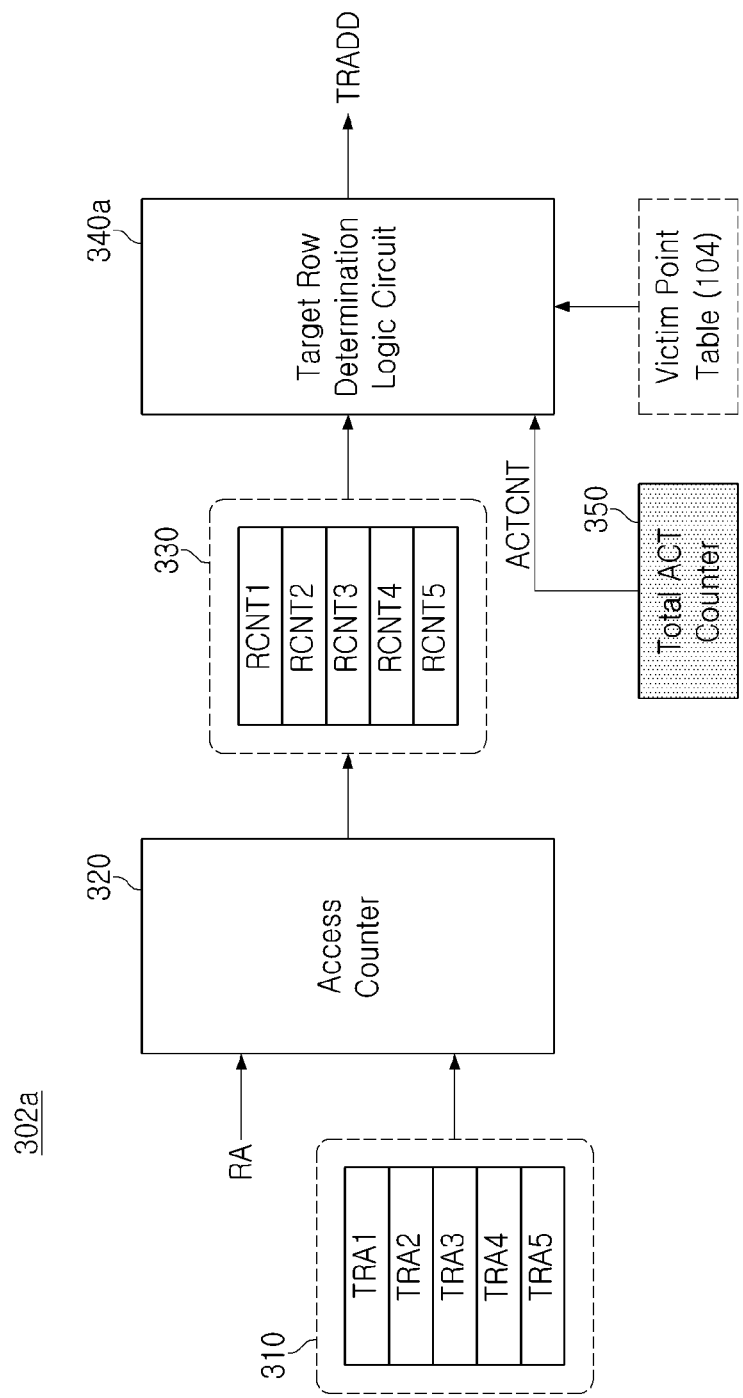
FIG. 3B is a diagram illustrating a TRR logic circuit according to an example embodiment.

FIG. 3B is a diagram illustrating a TRR logic circuit 340a according to an example embodiment. Referring to FIG. 3B, the TRR logic circuit 340a may further include a total ACT counter 350 configured to count-up an ACT count value in response to an input/output operation differently from the example in FIG. 3B.

The target row address determination logic circuit 340a may select a target refresh address TRADD to be refreshed using the access count values RCNT1 to RCNT5 of the second registers 320 or the victim point table 104 whenever the total ACT count value is a multiple of a predetermined value.

Figure 4A:
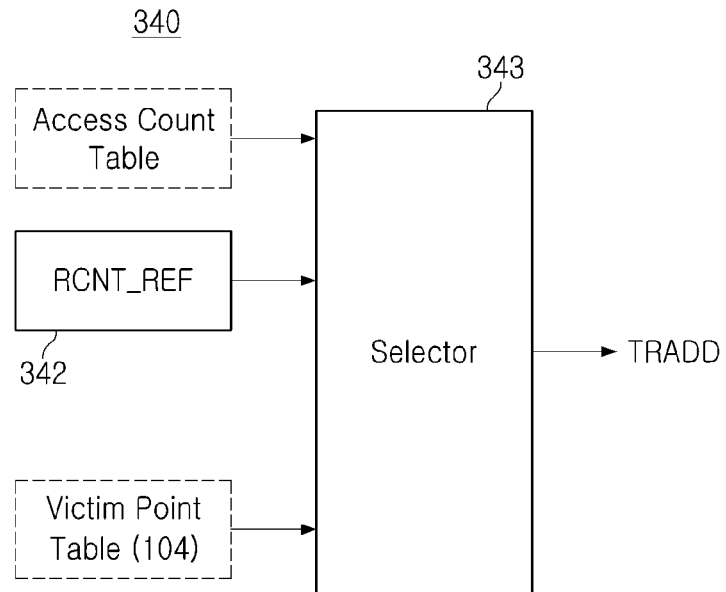
FIG. 4A is a diagram illustrating a target row address determination logic circuit according to an example embodiment.

FIG. 4A is a diagram illustrating a target row address determination logic circuit 340 according to an example embodiment. Referring to FIG. 4A, the target row address determination logic circuit 340 may include a reference value register 342 and a selector 343.

The reference value register 342 may store an access count reference value RCNT_REF.

The selector 343 may select row addresses adjacent to a row greater than the access count reference value RCNT_REF from among the access count values RCNT1 to RCNT5 as the target refresh address TRADD. In an example embodiment, the refresh operation may not be performed on row addresses smaller than the access count reference value RCNT_REF.

Also, the selector 343 may select a row address having the largest victim point value in the victim point table 104 as the target refresh address TRADD.

In an example embodiment, when multiple maximum values of victim point values are present in the victim point table 104, one of the row addresses of the victim point table 104 may be selected as a target refresh address TRADD by a predetermined method. The predetermined method may be a method of determining according to a number corresponding to a row address. For example, a row address having the largest number corresponding to the row address may be determined as the target refresh address TRADD. The number corresponding to the row address may be information indicating a physical position of the memory device.

The access count reference value RCNT_REF may vary according to temperature.

Figure 4B:
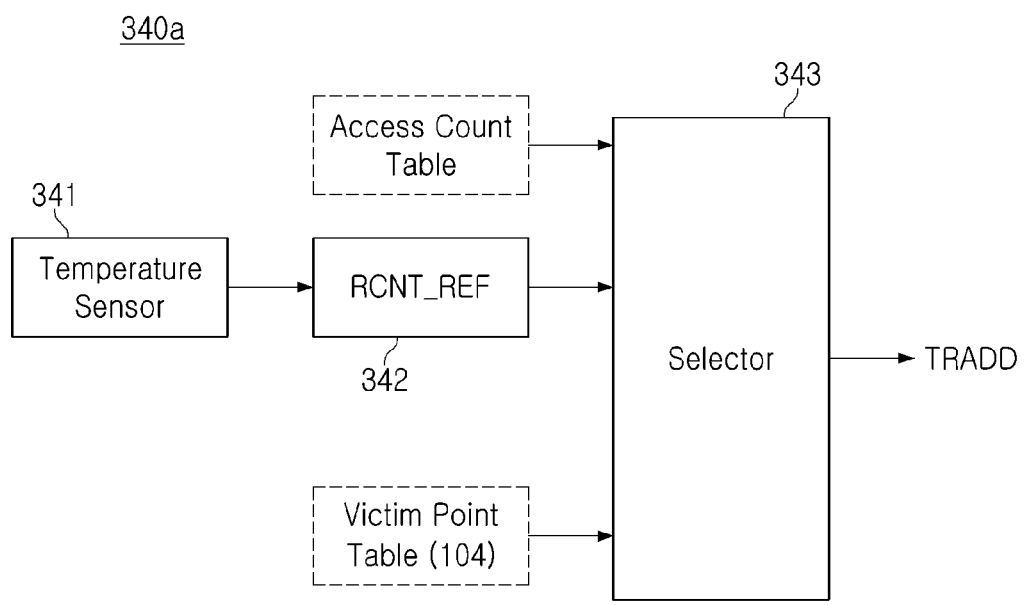
FIG. 4B is a diagram illustrating a target row address determination logic circuit according to an example embodiment.

FIG. 4B is a diagram illustrating a target row address determination logic circuit 340a according to an example embodiment. Referring to FIG. 4B, the target row address determination logic circuit 340a may further include a temperature sensor 341 differently from the example 340 in FIG. 4A.

FIGS. 5A, 5B, 5C, 5D, and 5E are diagrams illustrating a process of calculating a victim point in a memory device 100 according to an example embodiment.

The memory device in an example embodiment may aggregate the accumulated access count value of each row for each unit time period, may calculate the accumulated victim points from the victim's point of view, and may select a rows to which T-Refresh (target refresh) is to be performed in ascending order of the corresponding victim points.

In the description below, the process of calculating the victim point will be described as an example. As illustrated in FIG. 5A, it is assumed that five rows R1 to R5 may be present in sequence in a memory bank and may be adjacent to each other. Here, it is assumed that the victim point of the third row R3 may be calculated. In this case, whenever the second row R2 the most adjacent to the third row R3 is accessed once, the victim point of the third row R3 may increase by one. Similarly, whenever the fourth row R4 the most adjacent to the third row R3 is accessed in the opposite direction once, the victim point of the third row R3 may increase by one.

Also, rows R1 and R5 adjacent to the third row R3 with another row therebetween may also damage the third row R3. In this case, the rows may not damage the third row R3 as much as the most adjacent rows R2 and R4, but whenever the adjacent row R1 or R5 is accessed once, the victim point of the third row R3 may increase by a value less than one (e.g., 0.25). That is, victim points may be added to the rows within a certain distance from the accessed row, and the victim point value added to each row may decrease as the distance from the accessed row increases.

By the above-described method, the memory device 100 may aggregate the accumulated victim points, and may select a row having the highest victim points as a T-refresh target row at a time point at which T-refresh is to be performed.

The memory device may calculate an adjacent row of an accessed row and may perform an accumulation operation of increasing the victim points of the corresponding adjacent row for each access. This method may consume a lot of resources. The memory device 100 in an example embodiment may calculate data related to an accessed row address and an access count in a corresponding time period in each predetermined time period. Also, the victim point table 104 may be updated every time a predetermined time period ends. Accordingly, resource consumption due to frequent update of the victim point table 104 may be prevented.

During the unit time period (hereinafter, T1, where T1 may be represented as an absolute time or the sum of the access count values for each row in the memory device), data about the accumulated access count of each row, that is, the row access table may be calculated as illustrated in FIGS. 5A-5E. That is, as illustrated in FIG. 5B, the table may be a row access table obtained by accumulating access counts from t=0 to t=T1. This row access table may be calculated using internal registers and counters of R/H defense logic.

In this case, the victim point table listing the victim point of each row may be calculated as illustrated in FIG. 5C. That is, the table in FIG. 5C may be a victim point table obtained by accumulating victim points from t=0 to t=T1.

When t=T1, when the row access table as illustrated in FIG. 5B is calculated, the row address and count value of the register of the R/H defense logic may be initialized. From this time point on, a new access count may be counted for another T1 time length (that is, from t=T1 to t=2*T1). Then, when t=2*T1, the row access table illustrated in FIG. 5D may be obtained.

Also, the victim point table may not be initialized differently from the row access table, and may be continuously accumulated in addition to previous data. Accordingly, when t=2*T1, the victim point table in FIG. 5E may be obtained. The victim point table illustrated in FIG. 5E may be an accumulation of entire victim counts from t=0 to t=2*T1. In this case, referring to FIG. 5D, that may be a record in which the fifteenth row R15 has been recently accessed (during a time from t=T1 to t=2*T1). Accordingly, the fifteenth row R15 has been row-refreshed. Accordingly, the victim point of the 15th row R15 may be initialized from 30 to 0. However, even when there is a record in which the fifteenth row R15 is accessed for the time period from t=T1 to t=2*T1, but when there is a record in which the fourteenth row R14 or the sixteenth row R16 adjacent to the fifteenth row R15 is accessed for the time period from t=T1 to t=2*T1, the victim point in the 15th row R15 may be initialized to 0 and may be added based on the access record for the time period from =T1 to t=2*T1 of the fourteenth row R14 and the sixteenth row R16. For example, when there is a record in which the fifteenth row R15 is accessed during the time period from t=T1 to t=2*T1, but during the time period, the fourteenth row R14 is accessed 20 times and the sixteenth row R16 is accessed 30 times, the victim point in the 15th row R15 may be initialized from 30 to 0, and may increase by 50, which is the sum of the number of accesses in the fourteenth row R14 and the sixteenth row R16, and may become 50.

As described above, the operation of accumulating the victim point table may be continued whenever time T1 elapses. Also, at the time at which T-refresh is performed, T-refresh may be performed on a row (at least one row) having the highest victim point in the victim point table at that time. Thereafter, the victim point of the row targeted for T-refresh may be initialized to zero.

The length T1 of the above-described time period may be adaptively changed according to the risk of a row hammer attack detected in real time. For example, the length of the time period T1 may be adaptively changed according to an eviction count (the number of times a row address is evicted from a register), which may be an indicator indicating the risk of a row hammer attack. Too many evictions may indicate that accuracy of the row access table may be low. For this reason, the above-described method may be applied to ensure the accuracy of the row access table to be above a predetermined level. For example, when the degree to which the eviction count in the most recent target refresh period (e.g., tREFI) has increased is a predetermined level or higher than the degree (e.g., an increase rate or the number of times of increase) to which the eviction count in the immediately preceding target refresh period has increased, by reducing the length T1 of the time period, the victim point table may be updated more frequently. As another example, when the eviction count from the update point of the immediately preceding victim point table has accumulated by N times (N is a natural number), the operation of updating the victim point table may be performed.

The memory device in an example embodiment may determine a T-refresh target row with high accuracy through data regarding the degree of damage to each row.

Figure 6A:
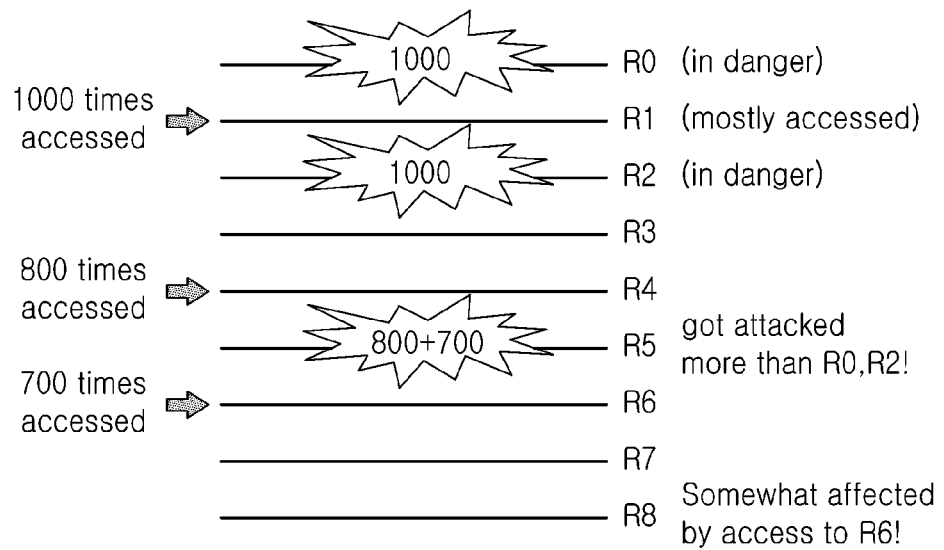
FIGS. 6A and 6B are diagrams illustrating an effect of a refresh operation using a victim point table according to an example embodiment.
Figure 6B:
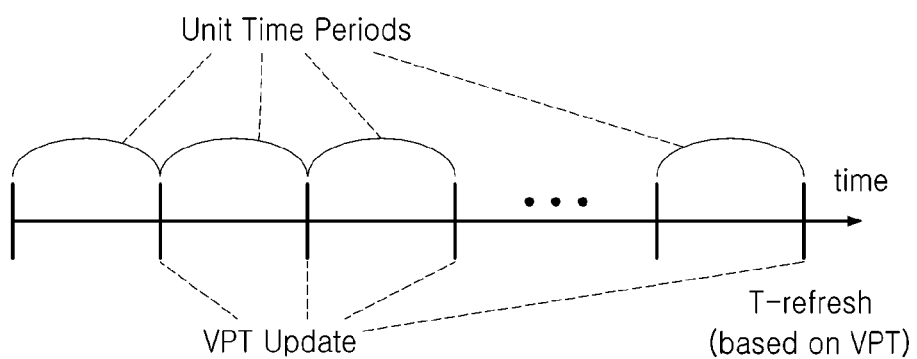

FIGS. 6A and 6B are diagrams illustrating an effect of a refresh operation using a victim point table according to an example embodiment. Row hammer may refer to the phenomenon in which information is lost when bits stored in a row adjacent to the corresponding row are flipped by electromagnetic interference caused by an aggressor row intensively activated within a relatively short period of time. The row hammer issue may be intensified as the process of a product is refined. To detect an aggressor row causing the row hammer, the row hammer mitigation logic may aggregate the access count of the rows, but the resource for storing information may be limited, the stored information may be easily lost, and also the victim-centered aggregation may not be possible.

As illustrated in FIG. 6A, even when victim-centered aggregation is performed, it may be burdensome to calculate the address of the victim row of the aggressor row for each access.

As illustrated in FIG. 6B, the T-refresh period (e.g., tREFI) may be divided into a plurality of unit time periods. In an example embodiment, the unit time period may be an absolute time. For example, the unit time period may be configured to have a length equal to ¹⁄₁₀ of the T-refresh period. In another example embodiment, the unit time period may be the sum of the access counts of each row. For example, the unit time period may be configured to end when the total number of times of accesses applied to the rows of the memory device from the time at which the unit time period reaches 100 times. In an example embodiment, the access count table may be created by aggregating the access count of each row within a unit time period.

In an example embodiment, the victim point table may be updated based on the access count table in every unit time period. The victim point may indicate the degree of damage to a specific row address due to the access of the adjacent address.

In an example embodiment, the access count table may be aggregated for each unit time period. In an example embodiment, the victim points calculated by the access count table for each unit time period may be continuously accumulated, and the accumulated value may be updated in the victim point table.

FIGS. 7A, 7B, 7C, and 7D are diagrams illustrating various conditions for starting a refresh operation using a victim point table in a memory device according to an example embodiment. In FIGS. 7A-7D, the memory device MEM may correspond, for example, to the memory device 100, and the memory controller MEMCNTL may correspond to the memory controller 200.

Figure 7A:
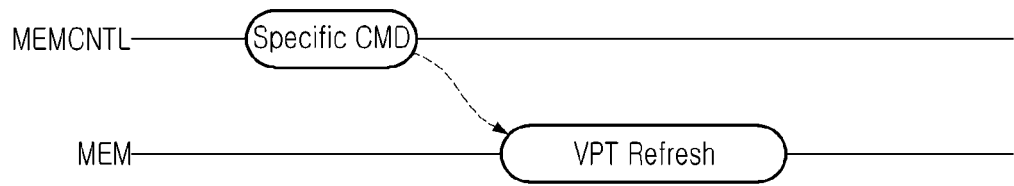
FIGS. 7A, 7B, 7C, and 7D are diagrams illustrating various conditions for starting a refresh operation using a victim point table in a memory device according to an example embodiment.
Figure 7B:
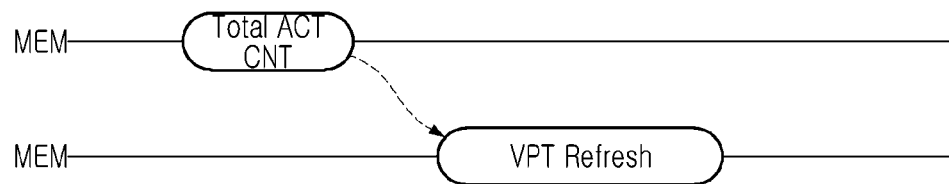
Figure 7C:
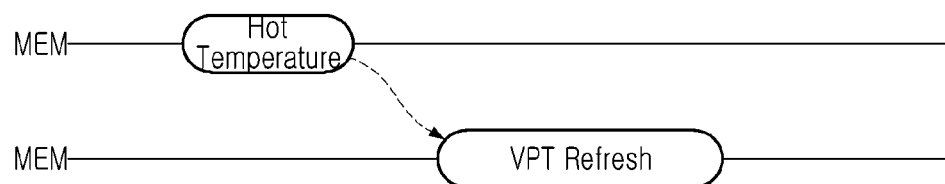
Figure 7D:
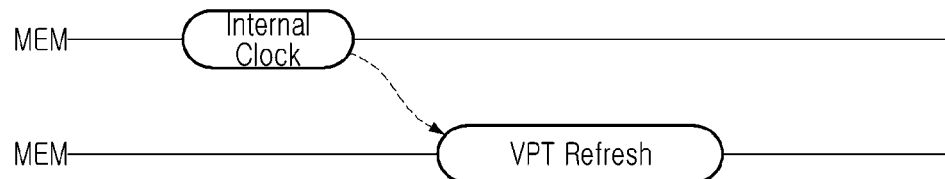

As illustrated in FIG. 7A, the memory device MEM may receive a special command from the memory controller MEMCNTL and may perform a refresh operation using the victim point table 104 in response to the special command. As illustrated in FIG. 7B, the memory device MEM may monitor the ACT count autonomously and may perform a refresh operation using the victim point table 104 whenever the total ACT count value is a multiple of a predetermined value. As illustrated in FIG. 7C, the memory device MEM may perform a refresh operation using the victim point table 104 when the temperature of the memory device is high. As illustrated in FIG. 7D, the memory device MEM may perform a refresh operation using the victim point table 104 whenever the count value of the internal clock is a multiple of a predetermined value.

The victim point table in an example embodiment may be periodically or aperiodically uploaded to the memory device.

Figure 8A:
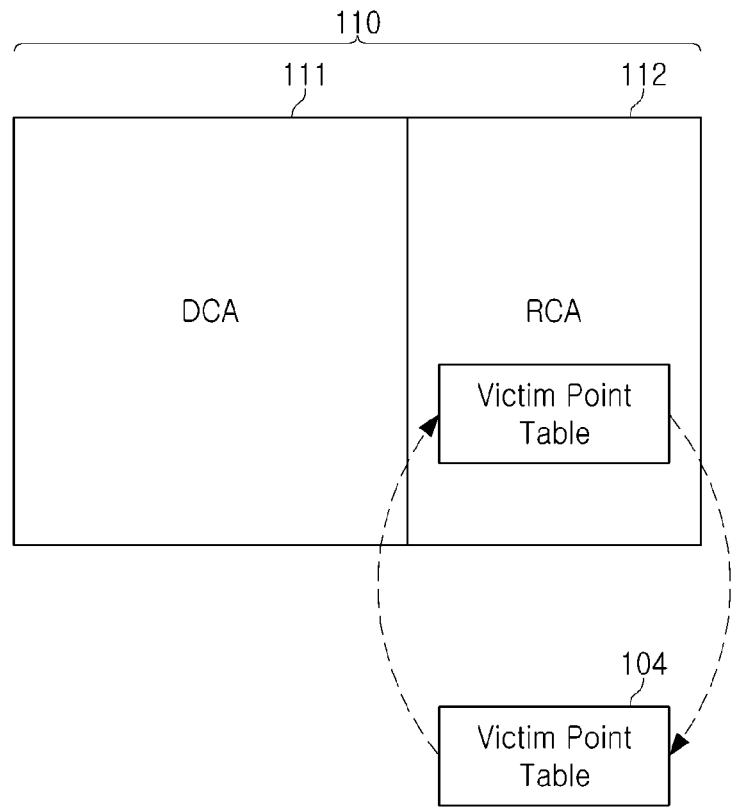
FIGS. 8A and 8B are diagrams illustrating an example in which a victim point table is uploaded to a memory device according to an example embodiment.

FIG. 8A is a diagram illustrating the example in which a victim point table is uploaded to a memory device according to an example embodiment. Referring to FIG. 8A, the memory cell array 110 may include a data cell array DCA 111 and a redundancy cell array RCA 112. The victim point table 104 may be periodically or aperiodically uploaded to a specific region of the redundancy cell array 112.

In an example embodiment, the victim point table 104 may be stored in a spare memory cell in response to an internal command. The loading operation may be to secure sufficient capacity for storage of the victim point table 104. Accordingly, the loading operation may prevent information omission.

A portion of the memory cell may be dedicated to storing the victim point table. Calculation and update of the victim point may be performed in a logic of the memory device 100. In this case, the logic may create a row access table by reading a register value of the row hammer defense logic whenever it is necessary to update the victim point table, and the logic may retrieve the previous victim point table from the dedicated memory cell 112 and may update the victim point table using the values of the row access table. The updated victim point table may be stored again in a dedicated memory cell. In an example embodiment, the operation of updating the victim point table 104 may not be frequently performed as compare to the operation of updating the row access table performed whenever there is a row access. Accordingly, the logic may perform the above-described operation with a relatively sufficient margin.

Figure 8B:
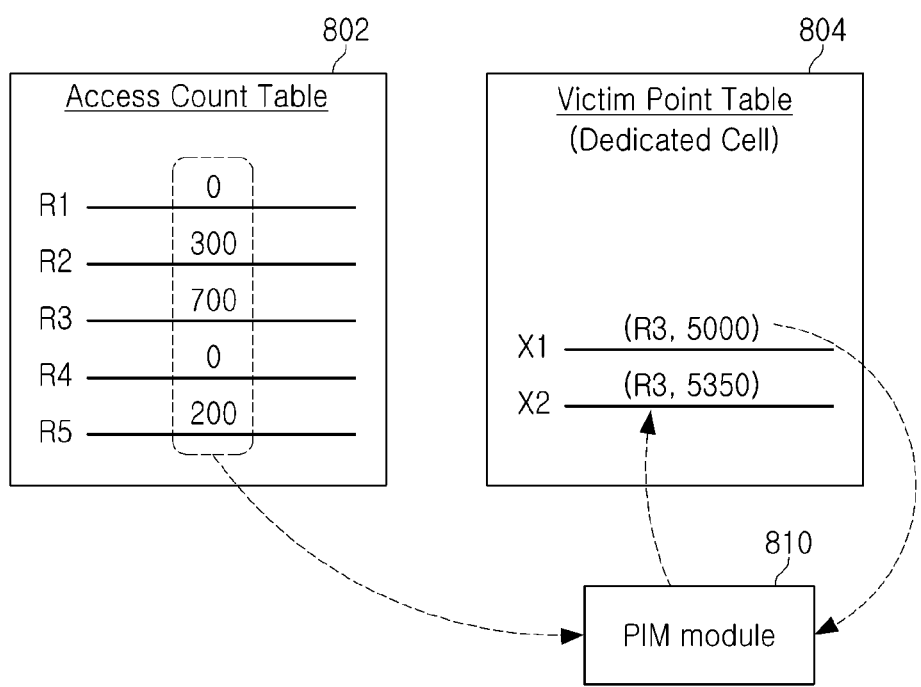

FIG. 8B is a diagram illustrating a process of updating a victim point table according to an example embodiment. Referring to FIG. 8B, the process of updating the victim point table 804 may be as below.

When the victim point table 804 is updated, the memory device 100 may use a MAC operation function of the PIM module 810 implemented therein. For example, it is assumed that information "R3, 5000" is stored in the first dedicated row X1 among dedicated DRAM cells, which may indicate that the victim point of the third row R3 is 5000. In this situation, it is assumed that, when the update of the victim point table 804 becomes necessary, the second row R2 immediately adjacent to the third row R3 may be accessed 300 times during the most recent unit time period and the fifth adjacent row adjacent to the third row R3 with another row therebetween may be accessed 200 times.

In this case, the PIM module 810 may read the access count values from the access count table 802 and may read the values "R1, 5000" from the first dedicated row X1, 5350 (1*300+0.25*200+5000) may be obtained through a MAC operation. Here, 0.25 may be a weight value of when damage is received from a row adjacent thereto with another row therebetween. Accordingly, the PIM module 810 may store the values "R1, 5350" in the second dedicated row X2 among the dedicated memory cells. In the next update, the PIM module may read a value from the second dedicated row X2, may perform a MAC operation, and may store the value in the first dedicated row X1.

In an example embodiment, the dedicated memory cell may be stored by subtracting a few bits on the last significant bits (LSB) side of the victim point value so as to reduce the space to be used. For example, to store the victim point value of 49 ("110001" in binary), the last 3 bits "001" may be removed and only the first 3 bits "110" may be stored in the dedicated memory cell. In this case, three memory cells per one victim point value may be saved. When the PIM module 810 reads the stored value, it may be recognized as "110000 (48 in decimal)" by adding three zeros to the back of the value stored as "110". There may be some errors (49 may be recognized as 48), but which not be a substantial issue from the point of view of the victim's trend.

Differently from the method using the above-described PIM module 810, the memory device 100 may transmit necessary information to the controller having abundant resources whenever an update of the victim point table is necessary, and may request the update of the victim point table. Specifically, whenever a unit time period ends, the memory device 100 may transmit a row access table including an access count of each row during a corresponding unit time period to a controller. The controller may calculate a victim point of each row during a corresponding unit time period using the row access table, and may transmit the calculation result to the memory device 100. The memory device 100 may update the victim point table stored in the dedicated memory cell based on the calculation result.

In another example embodiment, the controller may be implemented to perform both creation and update of the victim point table. In this case, at the start of the target refresh period, the controller may create the victim point table in the initialized state (the victim points of all rows are zero). Whenever the unit time period ends, the controller may update the victim point table using the row access table corresponding to the unit time received from the memory device 100. When the target refresh period ends, the controller may select a target refresh address which may be the target of target-refresh based on the victim point table updated until the end of the target refresh period, and may provide the result of the selection to the memory device 100 and may perform the target refresh on the target refresh address.

Figure 9:
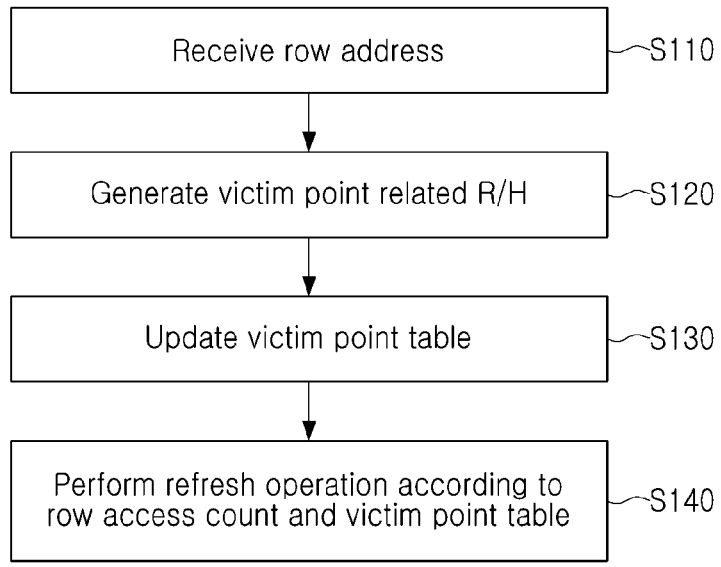
FIG. 9 is a flowchart illustrating a method of operating a memory device according to an example embodiment.

FIG. 9 is a flowchart illustrating a method of operating a memory device according to an example embodiment. Referring to FIGS. 1 to 9, the memory device 100 may operate as below.

In operation S110, the memory device 100 may receive a row address in response to an input/output request of the memory controller 200 (see FIG. 1). In operation S120, the memory device 100 may generate a victim point for target row addresses corresponding to the row address. In operation S130, the memory device 100 may update the victim point table with the victim point. Thereafter, in operation S140, the memory device 100 may perform a refresh operation using the row access count and the victim point table.

Figure 10:
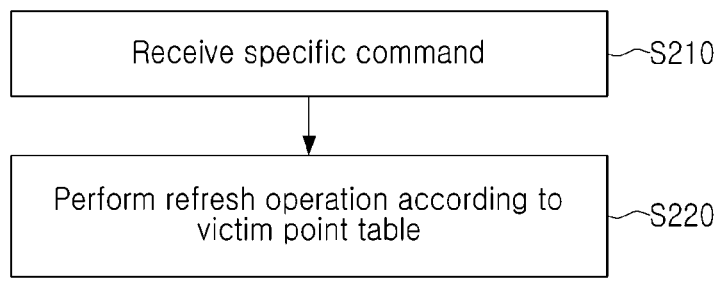
FIG. 10 is a flowchart illustrating a method of operating a memory device according to an example embodiment.

FIG. 10 is a flowchart illustrating a method of operating a memory device according to another example embodiment. Referring to FIGS. 1 to 10, the memory device may operate as below. In operation S210, the memory device 100 may receive a special command from the memory controller 200. In operation S220, the memory device 100 may perform a refresh operation using the victim point table.

Figure 11A:
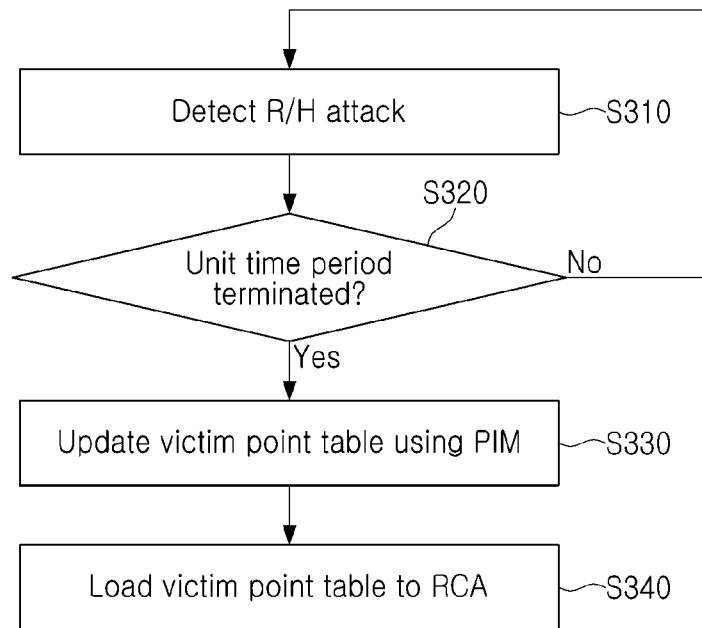
FIG. 11A is a flowchart illustrating a method of operating a memory device according to an example embodiment.

FIG. 11A is a flowchart illustrating a method of operating a memory device according to another example embodiment. Referring to FIGS. 1 to 11A, the memory device may operate as below.

In operation S310, the memory device 100 may monitor the row hammer attack. In operation S320, the memory device 100 may determine whether a unit time period for updating the victim point table has ended. In operation S330, when the unit time period has ended, the memory device 100 may update the victim point table using the PIM. When the unit time period has not ended, operation S310 may be performed. Thereafter, in operation S340, the memory device 100 may load the victim point table to the redundancy cell array RCA.

The memory device in an example embodiment may adjust the unit time period in real time while detecting the row hammer attack.

Figure 11B:
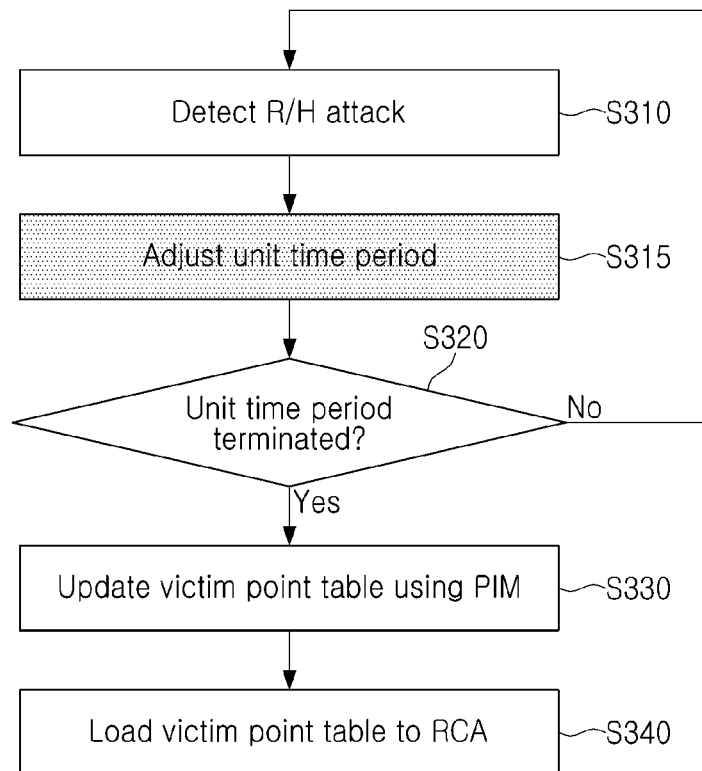
FIG. 11B is a flowchart illustrating a method of operating a memory device according to an example embodiment.

FIG. 11B is a flowchart illustrating a method of operating a memory device according to another example embodiment. Referring to FIG. 11B, the operation method may further include operation S315 adjusting a unit time period when a row hammer attack is detected, differently from the example illustrated in FIG. 11A.

In an example embodiment, the unit time period may be adaptively adjusted according to the detection result of the row hammer attack. For example, when an address eviction from a register for storing a row address increases, the unit time period may be shortened by a predetermined time. In an example embodiment, in an ideal case without access concentration (e.g., when the number of an address escape is equal to or less than a predetermined threshold number during a single period of T-refresh), the unit time period may be equal to the period of T-refresh, and accordingly, the example embodiment may not be practically applicable. That is, the example embodiment may be selectively applicable such that the example embodiment may operate only in a dangerous situation.

Figure 12:
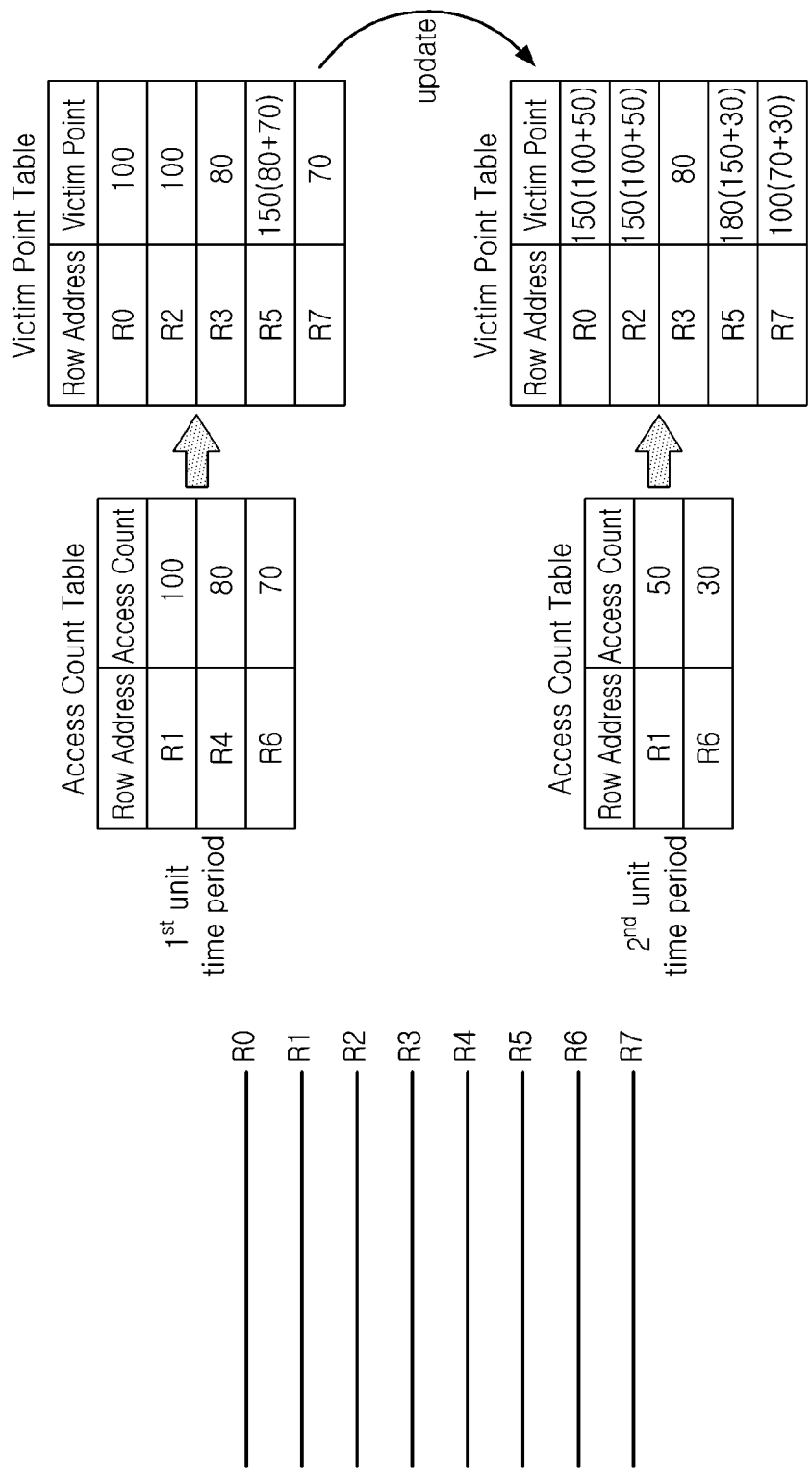
FIG. 12 is a diagram illustrating a process of updating a victim point table in each unit time period according to an example embodiment.

FIG. 12 is a diagram illustrating a process of updating a victim point table in each unit time period according to an example embodiment.

As illustrated in FIG. 12, the victim point table may be updated based on the access count table for each unit time period. The victim point may indicate the degree to which a predetermined row address has been damaged due to an access of an adjacent address. The access count table may be aggregated for each unit time period, and the victim point table may be updated by continuously accumulating the victim points calculated by the access count table for each unit time period.

In an example embodiment, T-refresh may be performed on the victim address that has been excessively damaged based on the victim point table. In an example embodiment, when the T-refresh time arrives, the refresh of the row address having the highest victim point may be performed.

When the victim points of all rows are less than the reference value, T-refresh may be skipped. In an example embodiment, the victim point of the T-refreshed victim address may be reset.

In an example embodiment, when the accessed row is in the victim point table, the corresponding row may initialize the victim point, which may be because the same effect as being refreshed may be obtained due to the access.

In an example embodiment, the victim point may be configured differently according to a distance from an accessed row (aggressor row). For example, for each aggressor row access, the victim point of the row immediately adjacent to the aggressor row may increment by 1, and the victim point of the row adjacent thereto with another row therebetween may increment by a smaller value (0.25 or 0.5). However, an example embodiment thereof is not limited thereto.

Figure 13:
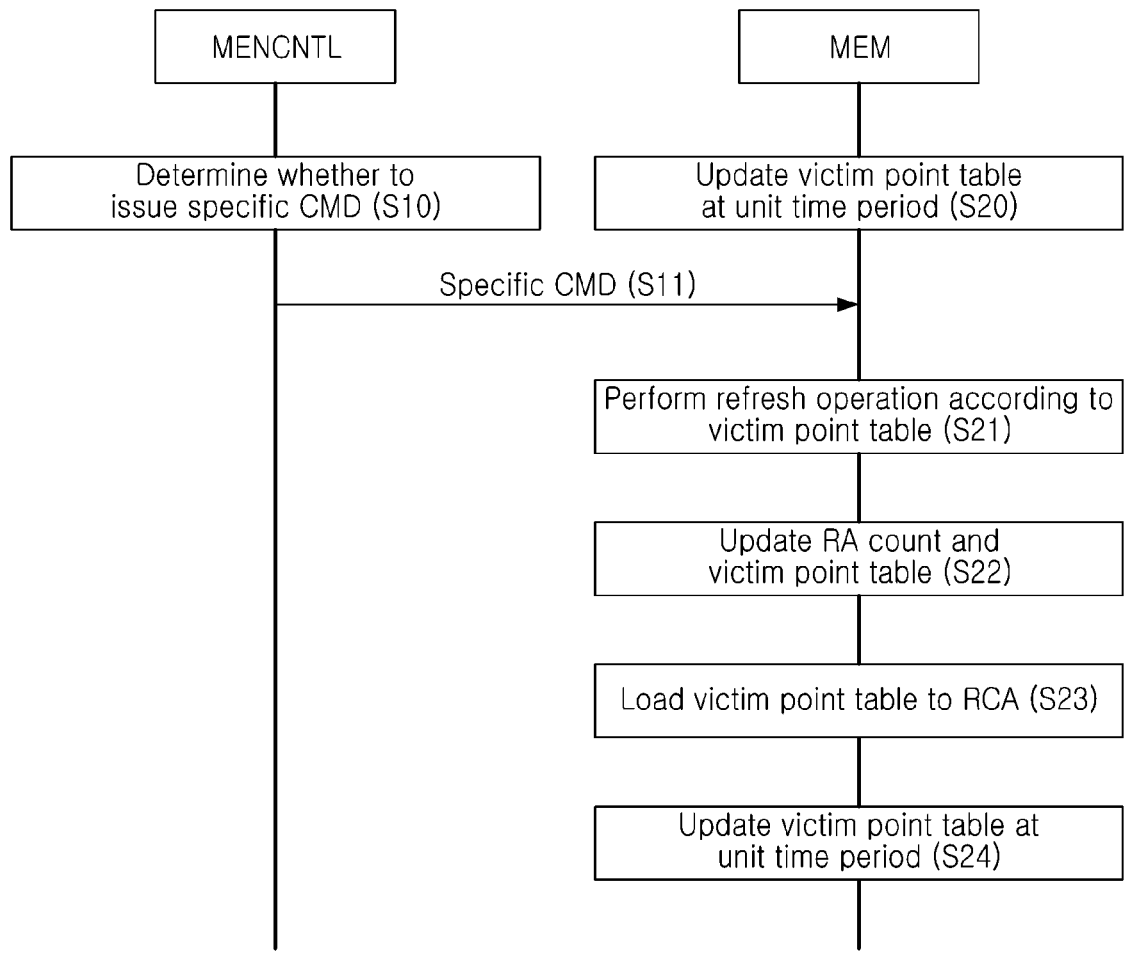
FIG. 13 is a ladder diagram illustrating a refresh operation of a memory system according to an example embodiment.

FIG. 13 is a ladder diagram illustrating a refresh operation of a memory system according to an example embodiment.

Referring to FIG. 13, in operation S10, the memory controller MEMCNTL may issue a special command for performing a refresh operation related to row hammer, and may transmit the issued special command to the memory device MEM. The refresh management module (RFM) command may be issued according to an internal policy of the memory controller MEMCNTL in operation S11.

In operation S20, the memory device MEM may update the victim point table in every unit time period. In operation S21, the memory device MEM may receive the special command, may select a target row using the victim point table in response to the received special command, and may perform a refresh operation on the selected target row. Thereafter, in operation S22, the memory device MEM may update the count value of the target row and the victim point table according to the refresh operation described above. Thereafter, in operation S23, the memory device MEM may load the victim point table into the redundancy cell array RCA. Thereafter, in operation S24, the memory device MEM may update the victim point table in every unit time period (S24).

The memory device in an example embodiment may further perform a refresh operation in response to a periodic refresh command received from the memory controller.

Figure 14:
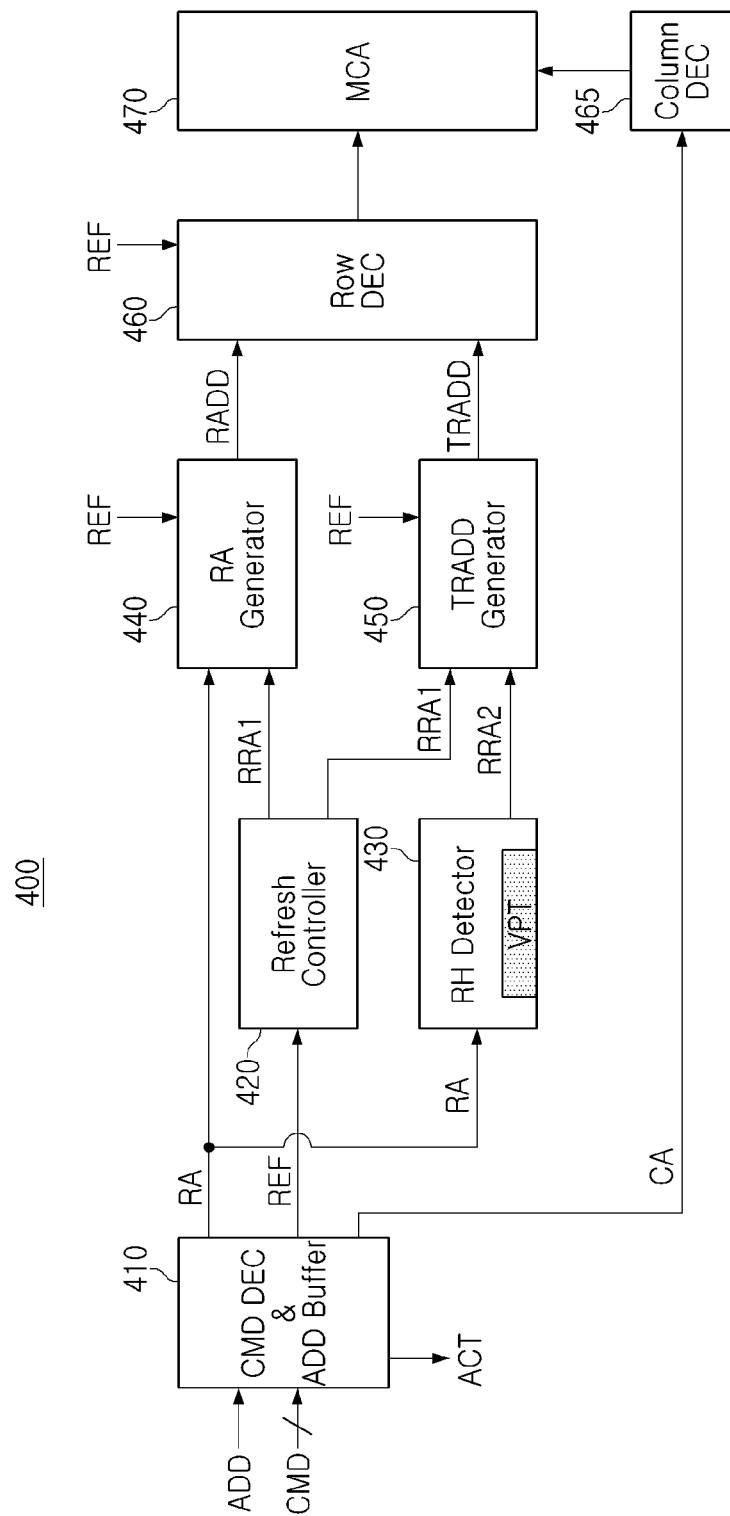
FIG. 14 is a diagram illustrating a memory device according to an example embodiment.

FIG. 14 is a diagram illustrating a memory device according to another example embodiment. Referring to FIG. 14, the memory device 400 may include a command decoder and address buffer 410, a refresh controller 420, a row hammer detector 430, a row address generator 440, a target row address generator 450, a row decoder 460, a column decoder 465, and a memory cell array 470.

The command decoder and address buffer 410 may generate an active command ACT, a refresh command REF, a read command, or a write command by decoding the command CMD. Also, the command decoder and the address buffer 410 may receive the address ADD and may output the row address RA and the column address CA. The row address RA may be input together with the active command ACT, and the column address CA may be input together with a read command or a write command. The refresh command REF may be a self-refresh command or an auto-refresh command. Here, when the refresh command REF is a self-refresh command, the refresh command REF may be internally generated. Also, when the refresh command REF is an auto refresh command, the refresh command REF may be provided from an external controller MEMCNTL (see FIG. 1).

The refresh controller 420 may generate the first refresh row address RRA1 in response to the refresh command REF. The first refresh row address RRA1 may be used to select a plurality of wordlines of the memory cell array MCA 470 or may be used to select a plurality of blocks of the memory cell array 470.

The hammer row detector 430 may input a row address RA in response to an active command ACT, may calculate a victim point using an access count table and a victim point table VPT, and may generate a second refresh row address RRA2 using the calculated victim point. In an example embodiment, the operation of calculating the victim point may be performed in each unit time period.

The row address generator 440 may select the row address RA in response to the active command ACT, and may select the first refresh row address RRA1 in response to the refresh command REF such that the row address signal RADD may be implemented.

The target row address generator 450 may output one of the first refresh row address RRA1 and the second refresh row address RRA as a target row address signal TRADD in response to the refresh command REF.

The row decoder 460 may generate wordline signals by decoding the row address signal RADD in response to the active command ACT, or may generate wordline signals by decoding at least one of the row address signal RADD and the target row address signals TRADD. The wordlines of the memory cell array 470 may be activated by the generated wordline signals.

The memory device in an example embodiment may include a row hammer protection circuit implemented in the form of a chip.

Figure 15A:
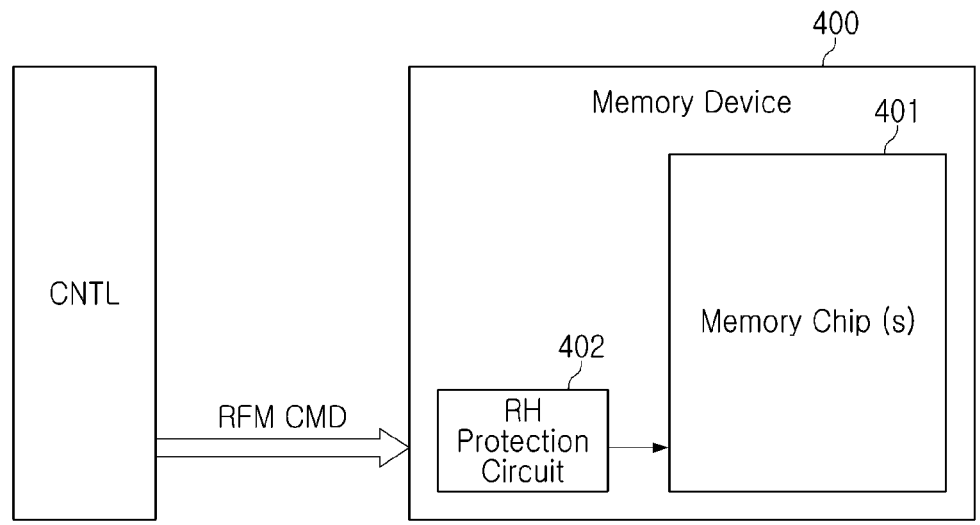
FIGS. 15A and 15B are diagrams illustrating a memory device having a row hammer protection circuit implemented in the form of a chip according to an example embodiment.
Figure 15B:
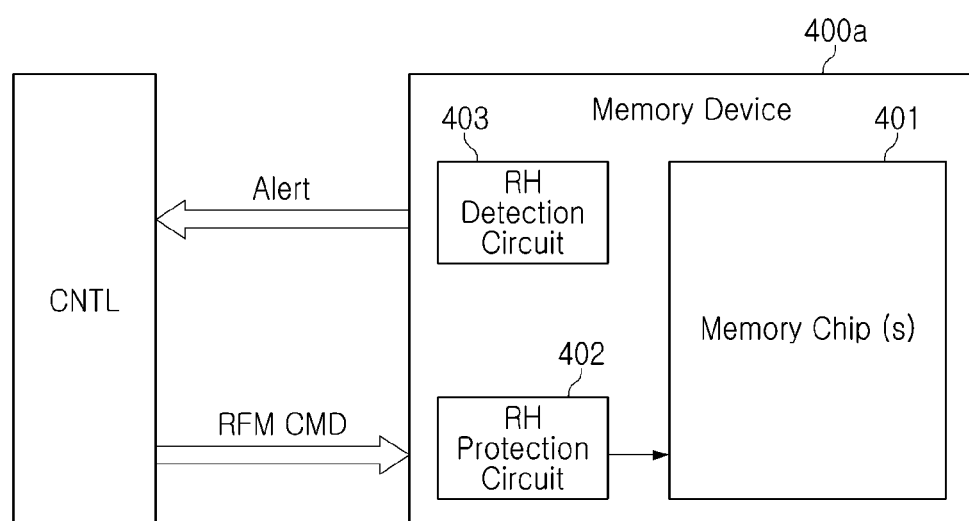

FIGS. 15A and 15B are diagrams illustrating a memory device having a row hammer protection circuit implemented in the form of a chip according to an example embodiment.

Referring to FIG. 15A, the memory device 400 may include at least one memory chip 401 and a row hammer protection circuit 402 configured to protect the row hammer of the memory chip 401. The raw hammer protection circuit 402 may perform the raw hammer defense operation using the victim point table described with reference to FIGS. 1 to 14 in response to a command (e.g., RFM CMD) received from the controller CNTL.

The memory device in an example embodiment may monitor the raw hammer in real time, and may output a warning signal according to the result thereof.

Referring to FIG. 15B, the memory device 400a may further include a row hammer detection circuit 403 as compared to the example in FIG. 15A. The raw hammer detection circuit 403 may monitor the raw hammer attack in real time, and may output a warning signal to the controller CNTL when the raw hammer attack is expected. The controller CNTL may receive the warning signal and may output a command (e.g., RFM CMD) for activating the row hammer protection circuit 402 to the memory device 400a.

The memory device in an example embodiment may operate in association with a refresh management command.

Figure 16:
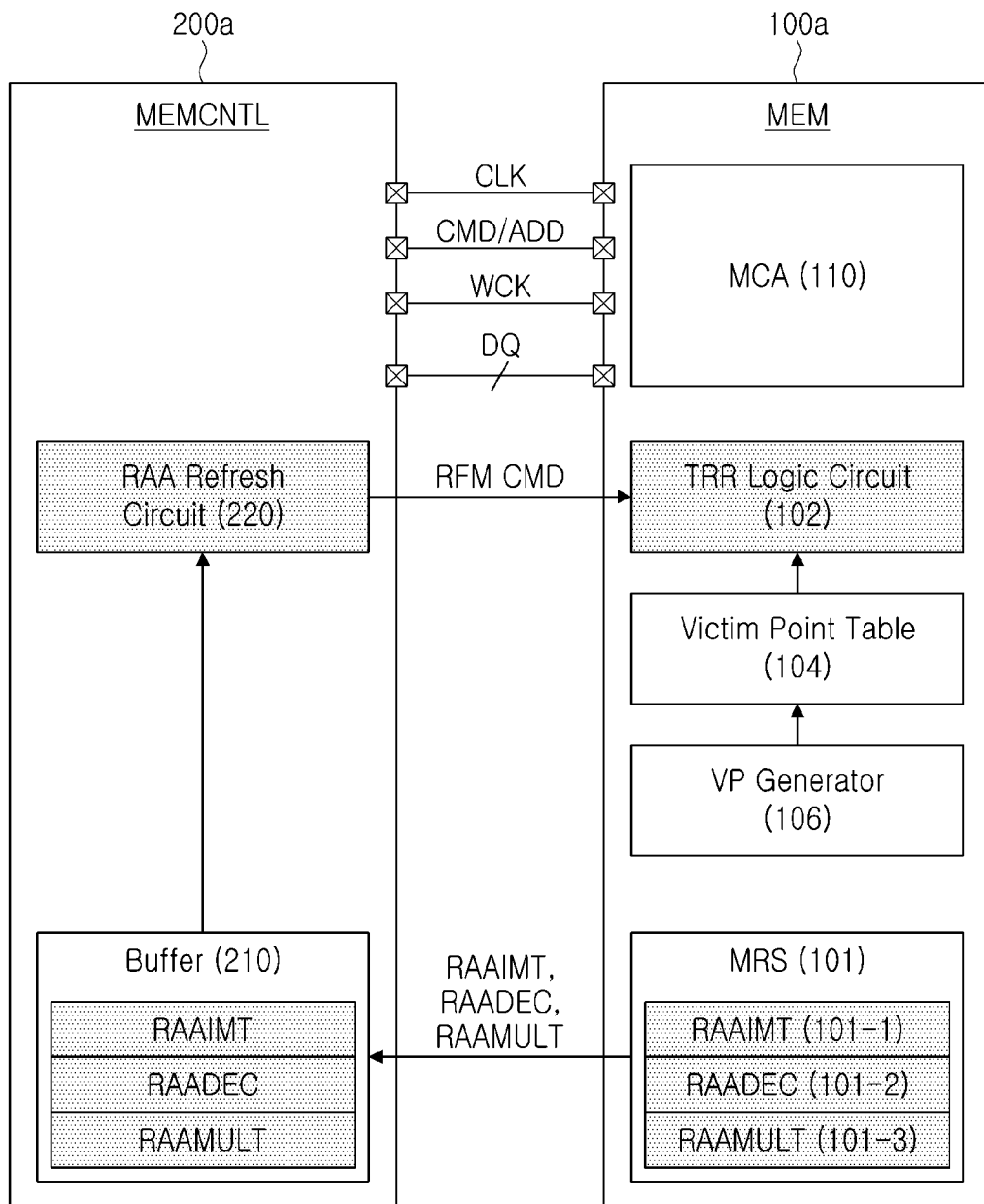
FIG. 16 is a diagram illustrating a memory device according to an example embodiment.

FIG. 16 is a diagram illustrating a memory device according to an example embodiment. Referring to FIG. 16, the memory system 20 may include a memory device 100 and a memory controller 200.

Referring back to FIG. 16, the memory device 100 may include a mode register circuit 101 (MRS), a TRR logic circuit 102, a victim point table 104, a victim accumulator 106 and an MCA 110 (MCA).

The mode register circuit 101 may include a plurality of mode registers configured to store values for setting an operation mode. Particularly, the mode register circuit 101 may include a first mode register 101-1, a second mode register 101-2, and a third mode register 101-3 for performing a refresh operation on a target row.

The first mode register 101-1 may store a reference value RAAIMT (a first value) for comparing rolling accumulated act (RAA) values. The RAA value may refer to the actual number of ACTs measured by the system (e.g., a controller) for the target row. That is, RAAIMT may be a threshold value for issuing a RFM command. For example, the controller 200 may issue the RFM command when the RAA value for the target row is greater than RAAIMT.

The second mode register 101-2 may store a minimum value RAADEC (a second value) for decreasing the stored RAA value after issuing the RFM command. RAADEC may be the minimum unit value of the RAA value which may decrease when the RFM command is issued once. In an example embodiment, the RAA value may decrease by RAAIMT×RAADEC after issuing the RFM command.

The third mode register 101-3 may store a value RAAMULT (a third value) necessary to determine the maximum value RAAMMT of the RAA value. RAAMULT may be a parameter determining how many times the RAADEC the value decreases when the REF command is issued once. The maximum value of the RAA value RAAMMT may be RAAIMT×RAAMULT.

In an example embodiment, RAAIMT, RAADEC, and RAAMULT may be determined by training during an operation of initializing the memory device 100. In another example embodiment, RAAIMT, RAADEC, and RAAMULT may be updated in real time in response to an RFM command. For example, RAAIMT, RAADEC, and RAAMULT may be determined according to a risk level.

The TRR logic circuit 102 may be implemented to perform a refresh operation using the victim point table 104 in response to an RFM command. The victim points table 104 may be updated by the victim point accumulator 106 during a unit time period.

The memory controller 200 may transmit a refresh command with reference to a warning signal provided from the memory device 100. For example, when a warning signal output by the memory device 100 is activated, the memory controller 200 may transmit an auto refresh command based on control signals (e.g., /RAS, /CAS, /WE) to the memory device 100. Also, as illustrated in FIG. 16, the memory controller 200 may issue an RFM command according to the RAA value. The memory controller 200 may include an RAA refresh circuit 220 and a buffer memory 210.

The RAA refresh circuit 220 may be implemented to store and manage RAA values for a plurality of target rows. The RAA refresh circuit 220 may issue an RFM command according to the RAA value using RAAIMT, RAADEC, and RAAMULT for the target row. The RFM command may include a specific bit (RU bit) instructing to change the stored values RAAIMT, RAADEC, and RAAMULT of the mode register circuit 101 of the memory device 100.

The buffer memory 210 may receive and store RAAIMT, RAADEC, and RAAMULT from the memory device 100.

Figure 17:
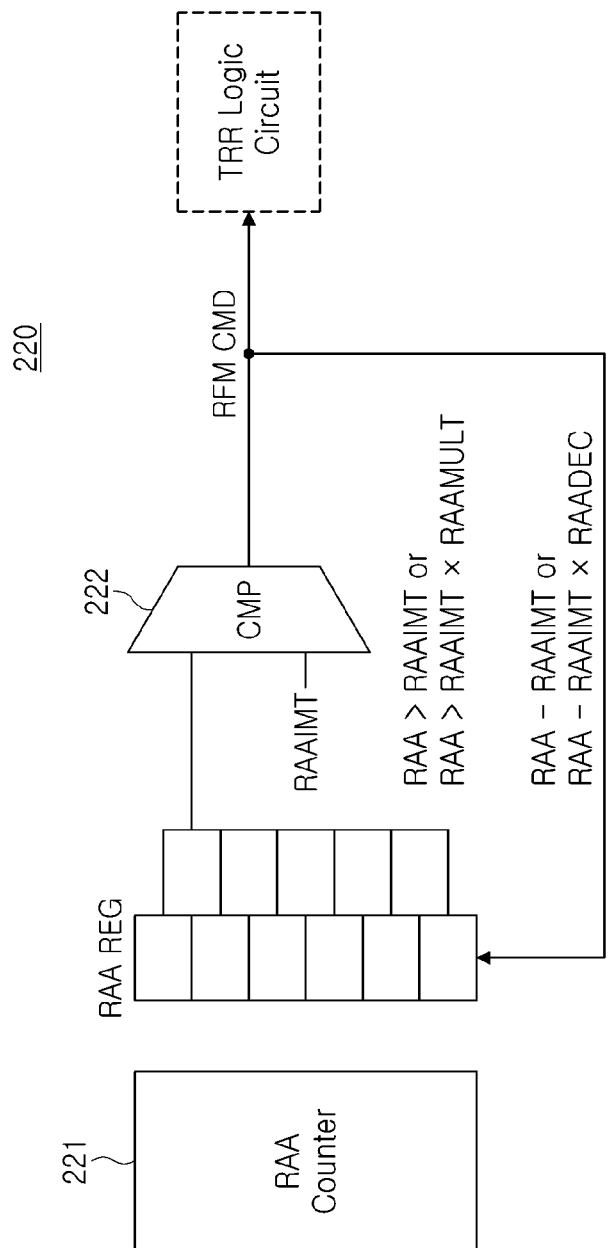
FIG. 17 is a diagram illustrating a rolling accumulated act (RAA) refresh circuit according to an example embodiment.

FIG. 17 is a diagram illustrating an RAA refresh circuit 220 according to an example embodiment.

The buffer memory 210 of the memory controller 200 may include registers corresponding to a plurality of target rows and storing an RAA value. The RAA counter 221 of the RAA refresh circuit 220 may increase the RAA value of the ACT bank by one during ACT. The RAA value may be stored in the corresponding register. The comparator CMP 222 may output the RFM command when the RAA value stored in the register corresponding to the target row is greater than RAAIMT. In this case, the RFM command may be transmitted to the TRR logic 102 of the memory device 100. When the RFM command is issued, the RAA refresh circuit 200 may decrease the RAA value corresponding to the target row by RAAIMT or RAAIMT×RAADEC. The reduced RAA value may be stored in a corresponding register.

When the corresponding RAA value of the target row reaches the maximum value (RAAMMT=RAAIMT*RAAMULT), the RAA refresh circuit 220 may not perform ACT anymore and may issue an RFM command, and may transmit the issued RFM command to the TRR logic 102 of the device 100. Generally, the RFM command may be postponed, such that the RAA value stored in the register may be larger than the RAAIMT.

The memory controller 200 may read RAAIMT, RAADEC, and RAAMULT and may store the RAAIMT, RAADEC, and RAAMULT in the memory device 100 during system booting. The RAA refresh logic 220 may use the stored RAAIMT, RAADEC, and RAAMULT for the RAA operation. Also, by adding a register update bit (RU bit) to the RFM command, the memory controller 200 may update the internal RAAIMT, RAADEC, and RAAMULT of the memory device 100 according to the risk level in real time.

The example embodiment may be applicable to a memory module.

Figure 18:
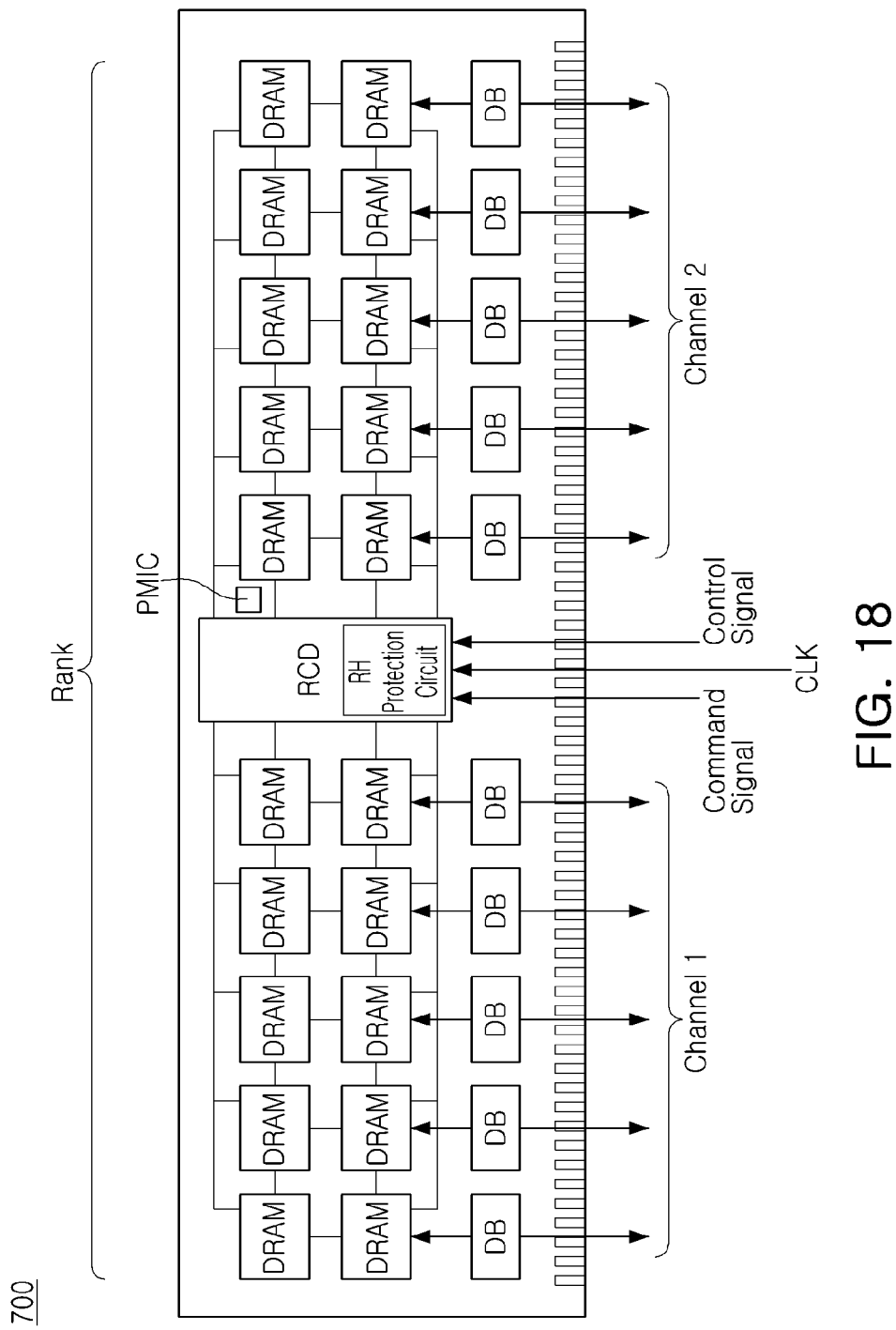
FIG. 18 is a diagram illustrating a memory module according to an example embodiment.

FIG. 18 is a diagram illustrating a memory module 700 according to an example embodiment. Referring to FIG. 18, the memory module 700 may include a plurality of memory chips DRAM each including a memory cell array, a buffer chip RCD configured to route transmission/reception signals with the memory controller or to manage memory operations for the memory chips, and a power management chip PMIC. Each of the plurality of memory chips may perform a refresh operation on target rows using the victim point table as described with reference to FIGS. 1 to 17.

The RCD may control the memory chips DRAM and the power management chip PMIC according to the control of the memory controller. For example, the RCD may receive a command signal, a control signal, and a clock signal from the memory controller. In an example embodiment, the RCD may include a row hammer protection circuit.

Each of the memory chips DRAM may be connected to a corresponding data buffer among the data buffers DB through a corresponding data transmission line and may transmit a data signal DQ and a data strobe signal DQS thereto and may receive the data signal DQ and the data strobe signal DQS therefrom. The memory chips DRAM may be connected to the data buffer DB through corresponding data transmission lines and may transmit parity data PRT and a data strobe signal DQS thereto and may receive the parity data PRT and the data strobe signal DQS therefrom.

The SPD chip may be implemented as a programmable read-only memory (EEPROM). The SPD chip may include initial information or device information of the memory module 1000. For example, the SPD chip may include initial information or device information such as a module type, module configuration, storage capacity, module type, and execution environment of the memory module 700. When the memory system including the memory module 700 is booted, the memory controller may read device information from the SPD chip and may recognize the memory module based on the read device information. In an example embodiment, the rank may include eight bank groups. Each of the bank groups may include four banks. In an example embodiment, the memory chips may be divided into first channel-only memory chips and second channel-only memory chips.

The memory controller may transmit a command to each channel of the memory chip DRAM. Each channel may have an independent command, address, and bus to operate in parallel with each other. One channel may have one or more ranks, and each rank may have an independent DRAM device. Also, all ranks in the channel may perform operations in parallel. Each rank may have a plurality of banks, and DRAM cells may be disposed in a two-dimensional arrangement form in the banks. Each bank may operate in parallel.

The memory device in the example embodiment may be applicable to a computing device.

Figure 19:
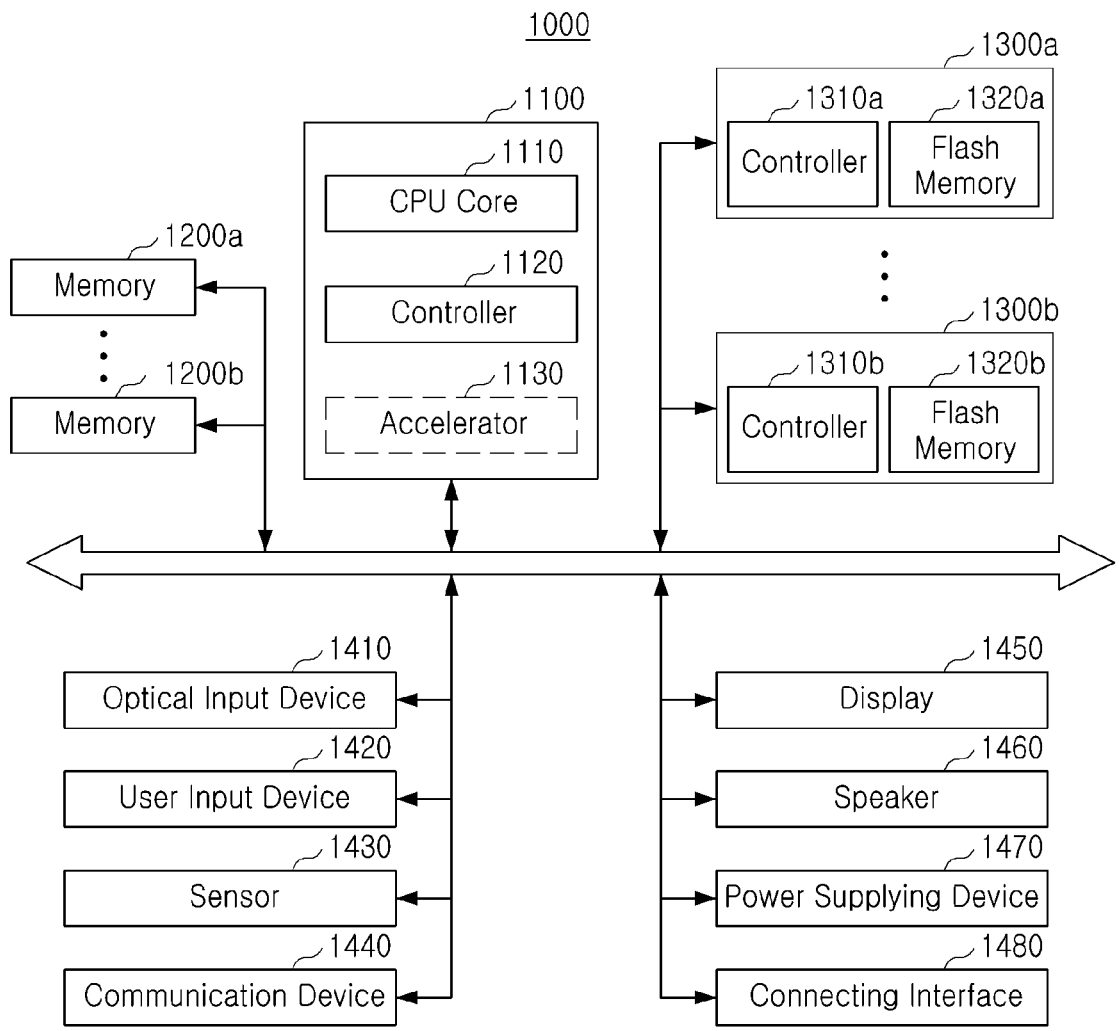
FIG. 19 is a diagram illustrating a computing system according to an example embodiment.

FIG. 19 is a diagram illustrating a computing system 1000 according to an example embodiment. Referring to FIG. 19, the system 1000 may include a main processor 1100, memories 1200a and 1200b and storage devices 1300a and 1300b.

The main processor 1100 may control the overall operation of the system 1000, more specifically, the operation of other components included in the system 1000. The main processor 1100 may be implemented as a general-purpose processor, a dedicated processor, or an application processor.

The main processor 1100 may include one or more CPU cores 1110, and may further include a controller 1120 for controlling the memories 1200a, 1200b or the storage devices 1300a, 1300b. In an example embodiment, the main processor 1100 may further include an accelerator block 1130 which may be a dedicated circuit for high-speed data operation such as artificial intelligence (AI) data operation. The accelerator block 1130 may include a graphics processing unit (GPU), a neural processing unit (NPU), or a data processing unit (DPU), and may be implemented as a chip physically independent from the other components of the main processor 1100.

The memories 1200a and 1200b may be used as the main memory device of the system 1000, and may include volatile memory such as SRAM or DRAM, or may include a non-volatile memory such as flash memory, PRAM or RRAM. The memories 1200a and 1200b may be implemented in the same package as the main processor 1100. Particularly, the memories 1200a and 1200b may calculate a victim point as described with reference to FIGS. 1 to 17 and may perform a refresh operation using the victim point table.

The storage devices 1300a and 1300b may function as non-volatile storage devices for storing data regardless of whether power is supplied or not, and may have a relatively large storage capacity as compared to the memories 1200a and 1200b. The storage devices 1300a and 1300b may include storage controllers 1310a and 1310b and non-volatile memory (NVM) storage 1320a and 1320b which may store data under the control of the storage controllers 1310a and 1310b. The nonvolatile memories 1320a and 1320b may include a V-NAND flash memory having a two-dimensional (2D) structure or a three-dimensional (3D) structure, but may include other types of nonvolatile memory such as PRAM or RRAM.

The storage devices 1300a and 1300b may be included in the system 1000 in a state physically separated from the main processor 1100, or may be implemented in the same package as the main processor 1100. Also, the storage devices 1300a and 1300b may have the same form as that of a solid state device (SSD) or a memory card, and may be detachably coupled to the other components of the system 1000 through an interface. The storage devices 1300a and 1300b may be applied with standard protocols such as universal flash storage (UFS), embedded multi-media card (eMMC), or non-volatile memory express (NVMe), but an example embodiment thereof is not limited thereto.

The photographing device 1410 may obtain a still image or a video, and may be implemented by a camera, a camcorder, or a webcam.

The user input device 1420 may receive various types of data input from the user of the system 1000, and may be implemented by a touch pad, a keypad, a keyboard, a mouse, or a microphone.

The sensor 1430 may detect various types of physical quantities which may be obtained from an external entity of the system 1000, and may convert the sensed physical quantities into electrical signals. The sensor 1430 may be implemented by a temperature sensor, a pressure sensor, an illuminance sensor, a position sensor, an acceleration sensor, a biosensor, or a gyroscope.

The communication device 1440 may transmit signals to and may receive signals from devices present externally of the system 1000 according to various communication protocols. The communication device 1440 may include an antenna, a transceiver, or a modem.

The display 1450 and the speaker 1460 may function as output devices for outputting visual information and auditory information to the user of the system 1000, respectively.

The power supply device 1470 may appropriately convert power supplied from a battery built in the system 1000 or an external power source and may supply the power to each component of the system 1000.

The connecting interface 1480 may provide a connection between the system 1000 and an external device connected to the system 1000 which may exchange data with the system 1000. The connecting interface 1480 may be implemented by various interface methods such as advanced technology attachment (ATA), serial ATA (SATA), external SATA (e-SATA), small computer small interface (SCSI), serial attached SCSI (SAS), peripheral component interconnection (PCI), PCI express (PCIe), NVM express (NVMe), IEEE 1394, universal serial bus (USB), secure digital (SD) card, multi-media card (MMC), embedded multi-media card (eMMC), universal flash storage (UFS), embedded universal flash storage (eUFS), compact flash (CF) card interface, or the like.

Figure 20:
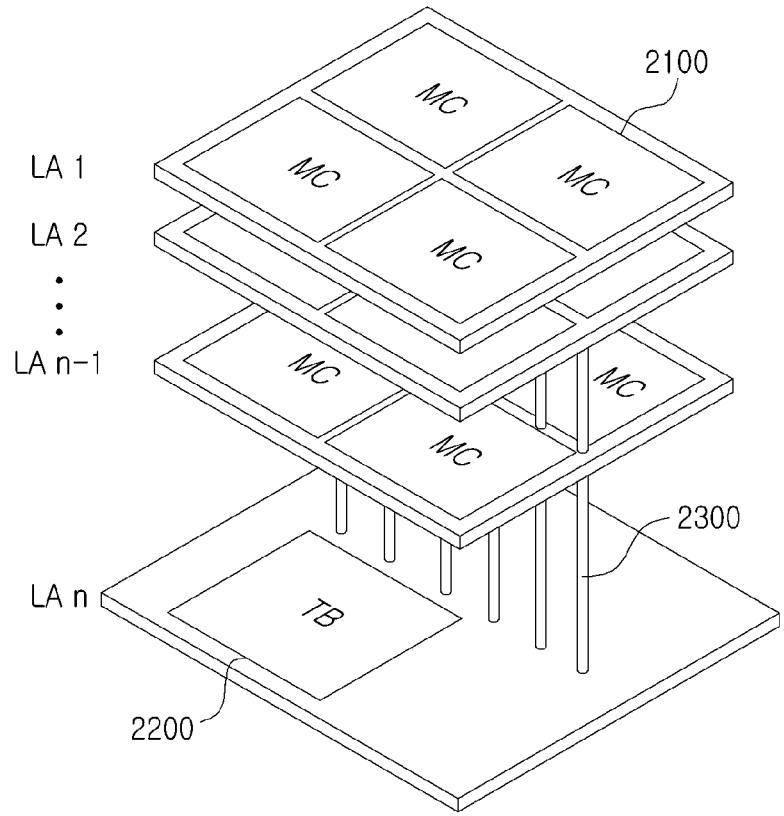
FIG. 20 is a block diagram illustrating a semiconductor package having a stack structure including a plurality of layers according to an example embodiment.

FIG. 20 is a block diagram illustrating a semiconductor package having a stack structure including a plurality of layers according to an example embodiment. Referring to FIG. 20, the semiconductor package 2000 may include a plurality of layers LA1 to LAn. Each of the first layer LA1 to the n−1 th layer LAn may be implemented as a memory layer (or a memory chip) including a plurality of memory cores MC. The memory core MC may include a memory cell array for storing data, a row decoder, a column decoder, a sense amplifier circuit, and an error correction circuit. The memory core MC in the example embodiment may calculate a victim point for an adjacent row as described above, and may determine a target refresh address using the calculated victim point.

The n-th layer LAn may be a buffer layer (or a buffer chip). In the semiconductor package 2000, the layers LA1 to LAn configured to be stacked may be interconnected to each other through a through silicon via 2300 (TSV). The buffer layer LAn may communicate with the external memory controller and the memory layers LA1 to LAn−1, and may route transmission/reception signals between the memory layers LA1 to LAn−1 and the memory controller. Furthermore, the buffer layer LAn may queue signals received from the memory controller or the memory layers LA1 to LAn−1. Also, the buffer layer LAn may include a training block 2200. The buffer layer LAn may perform a training operation on the memory layers LA1 to LAn−1 using the training block 2200.

Figure 21:
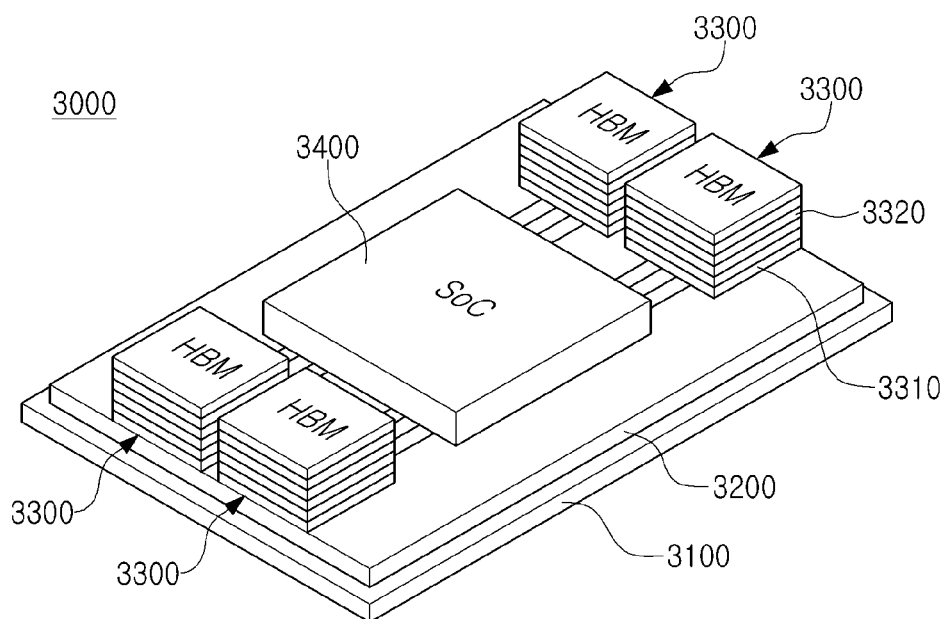
FIG. 21 is a diagram illustrating a semiconductor package including a stack semiconductor chip according to an example embodiment.

FIG. 21 is a diagram illustrating a semiconductor package including a stack semiconductor chip according to an example embodiment. Referring to FIG. 21, the semiconductor package 3000 may be implemented as a memory module including at least one stack semiconductor chip 3300 mounted on a package substrate 3100 such as a printed circuit board and a system-on-chip 3400 (SOC). An interposer 3200 may be selectively further provided on the package substrate 3100. The stack semiconductor chip 3300 may be formed by chip-on-chip (CoC).

The stack semiconductor chip 3300 may include at least one memory chip 3320 stacked on a buffer chip 3310 such as a logic chip. The memory chip 3320 may include a row hammer protection circuit using the victim point table as described with reference to FIGS. 1 to 17.

The buffer chip 3310 and the at least one memory chip 3320 may be connected to each other by a through silicon via (TSV). The buffer chip 3320 may perform an operation of training the memory chip 3320. The stack semiconductor chip 3300 may be implemented as, for example, a high bandwidth memory (HBM) of 500 GB/sec to 1 TB/sec or more.

In relation to DRAM, a phenomenon called row-hammer (R/H) has recently emerged as an issue. During DRAM operation, when a specific row is repeatedly active, the rows adjacent to the repeatedly active row may be affected by electromagnetic interference, and accordingly, a portion of the cell data connected to the adjacent row may be flipped, such that data may unintentionally change. To address the issue, the target row refresh technique (hereinafter referred to as TRR) may be used. According to this TRR technique, the number of activation of the rows may be counted for a certain period of time, and additional refresh (T-refresh) different from normal refresh may be performed on the rows (victim rows) adjacent to the row (aggressor row) recorded as having the highest count such that damage caused by R/H may be prevented. However, there may be blind spots in the TRR technique centering on aggressor row-oriented. For example, a victim row with a row accessed 800 times on either side may be more dangerous than a victim row adjacent to a single row accessed 1000 times. Accordingly, the risk may become similar to that of the row adjacent to a single row accessed 1600 times in total. To address the "double-sided R/H" issue, in the example embodiment, by changing the general method of managing the access count of the aggressor row, the degree of damage to the victim may be examined, and R/H mitigation may be performed based on the examination.

According to the aforementioned example embodiments, the memory device, the memory system including the same, and the method of operating the same may address the double-sided row hammer issue using the victim point table.

Also, the memory device, the memory system including the same, and the method of operating the same may prevent a row hammer attack, thereby improving data reliability.

At least one of the components, elements, modules or units (collectively "components" in this paragraph) represented by a block in the drawings such as FIGS. 1-4B, 8A-8B, and 14-19 may be embodied as various numbers of hardware, software and/or firmware structures that execute respective functions described above. At least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above example embodiments may be implemented in algorithms that execute on one or more processors. Furthermore, the components represented by a block or processing steps may employ any number of related art techniques for electronics configuration, signal processing and/or control, data processing and the like, While the disclosed embodiments has been particularly shown and described with reference to examples thereof, it will be understood that various changes in form and details may be made therein without departing from the spirit and scope of the following claims.

What is claimed is:

1. A memory device comprising:
   a memory cell array comprising a plurality of memory cells connected to a plurality of wordlines and a plurality of bitlines;
   a target row refresh logic circuit configured to:
      select a target row address from among a plurality of target row addresses as a refresh row address based on victim point values, and
      perform a refresh operation on first memory cells of the plurality of memory cells connected to a wordline of the plurality of wordlines indicated by the refresh row address;
   a victim point table configured to store the victim point values for the target row addresses; and
   a victim point accumulator configured to:
      receive a first row address from an external device, and
      accumulate a first victim point value for at least one target row address corresponding to the first row address during a unit time period.

2. The memory device of claim 1, wherein the target row refresh logic circuit is further configured to determine, at a predetermined time, the refresh row address based an access count table and the victim point table for the target row addresses.

3. The memory device of claim 2, wherein the predetermined time comprises a periodic refresh time.

4. The memory device of claim 2, wherein the predetermined time comprises a time for receiving a refresh management command from the external device.

5. The memory device of claim 2, wherein the predetermined time comprises a time comprising a plurality of unit time periods.

6. The memory device of claim 5, wherein the plurality of unit time periods is variable based on an eviction count value of a register.

7. The memory device of claim 1, wherein the victim point accumulator is further configured to differently accumulate a second victim point value for a target row address the most adjacent to the first row address and a third victim point value for a target row address not the most adjacent to the first row address.

8. The memory device of claim 1, wherein the victim point table is stored in a dedicated memory cell region of the memory cell array.

9. The memory device of claim 1, wherein the victim point accumulator is implemented in a processing-in-memory (PIM) module.

10. The memory device of claim 9, wherein the PIM module is configured to:
    read a previous victim point value from memory cells connected to a first dedicated row of a dedicated memory cell region the unit time period,
    accumulate a fourth victim point value according to an access of a row address in the previous victim point value, and
    store the accumulated victim point value in memory cells connected to a second dedicated row of the dedicated memory cell region.

11. A memory device comprising:
    an access count table configured to store an access count value for each of a plurality of target row addresses;
    a victim point table configured to store a victim point value for each of the plurality target row addresses and row addresses adjacent to the plurality of target row address; and
    a processing-in-memory (PIM) module configured to, based on a row address being received from an external device, calculate a new victim point value based on access count values of the access count table and victim point values of the victim point table.

12. The memory device of claim 11, further comprising:
    a target refresh address determination logic circuit configured to output a refresh row address based on the access count table and the victim point table.

13. The memory device of claim 12, further comprising:
    a counter configured to count a total count value of an active command,
    wherein, based on the total count value of the active command being a multiple of a predetermined value, the target refresh address determination logic circuit outputs a target refresh address.

14. The memory device of claim 11, wherein, based on each of the access count values being smaller than a reference value, a refresh operation is not performed.

15. The memory device of claim 14, wherein the reference value is variable according to a temperature.

16. A memory system comprising:
    at least one memory device; and
    a memory controller configured to:
       control the at least one memory device, and
       issue a refresh management command based on an accumulated command value,
    wherein the at least one memory device is configured to perform a target refresh operation based on a victim point table in response to the refresh management command, and
    wherein the victim point table is configured to store victim point values for target row addresses and row addresses adjacent to the target row addresses.

17. The memory system of claim 16, wherein the at least one memory device comprises a target refresh logic circuit configured to perform the target refresh operation on a row address having a largest value among victim point values in response to the refresh management command.

18. The memory system of claim 17, wherein the at least one memory device further comprises a refresh controller configured to perform a normal refresh operation in response to a refresh command periodically received from the memory controller.

19. The memory system of claim 16, wherein the at least one memory device is further configured to calculate victim point values in each unit time period of a plurality of unit time periods and to update the victim point table with the calculated victim point values.

20. The memory system of claim 16, wherein the at least one memory device is further configured to calculate the victim point values using a multiplier accumulator (MAC) of a processing-in-memory (PIM).

\* \* \* \* \*